(12) United States Patent
Edwards et al.

(10) Patent No.: US 6,591,369 B1
(45) Date of Patent: Jul. 8, 2003

(54) SYSTEM AND METHOD FOR COMMUNICATING WITH AN INTEGRATED CIRCUIT

(75) Inventors: David Alan Edwards, Bristol (GB); Anthony Willis Rich, Cambridge (NZ)

(73) Assignee: STMicroelectronics, Ltd. (GB)

( * ) Notice: Subject to any disclaimer, the term of this patent is extended or adjusted under 35 U.S.C. 154(b) by 0 days.

(21) Appl. No.: 09/410,638

(22) Filed: Oct. 1, 1999

(51) Int. Cl.[7] ............................................. G06F 13/42
(52) U.S. Cl. ..................... 713/400; 713/501; 327/39
(58) Field of Search ............................ 375/1, 354, 362; 395/281, 750, 550; 710/52, 65; 713/501, 400, 600, 1, 2, 100; 711/114; 600/520; 327/39–42, 44–47

(56) References Cited

U.S. PATENT DOCUMENTS

| | | | |
|---|---|---|---|
| 4,814,981 A | 3/1989 | Rubinfeld | 364/200 |
| 5,251,311 A | 10/1993 | Kasai | 395/425 |
| 5,386,565 A | 1/1995 | Tanaka et al. | 395/700 |
| 5,410,683 A | * 4/1995 | Al-Khairi | 327/294 |
| 5,423,050 A | 6/1995 | Taylor et al. | 395/575 |
| 5,434,804 A | 7/1995 | Bock et al. | 364/579 |
| 5,440,705 A | 8/1995 | Wang et al. | 395/421.1 |
| 5,448,576 A | 9/1995 | Russell | 371/22.3 |
| 5,452,432 A | 9/1995 | Macachor | 395/425 |
| 5,455,936 A | 10/1995 | Maemura | 395/183.11 |
| 5,479,652 A | 12/1995 | Dreyer et al. | 395/183.06 |
| 5,483,518 A | 1/1996 | Whetsel | 370/13 |
| 5,488,688 A | 1/1996 | Gonzales et al. | 395/183.1 |
| 5,530,804 A | * 6/1996 | Edgington et al. | 711/114 |
| 5,530,965 A | 6/1996 | Kawasaki et al. | 395/800 |
| 5,570,375 A | 10/1996 | Tsai et al. | 371/22.3 |
| 5,590,354 A | 12/1996 | Klapproth et al. | 395/800 |

(List continued on next page.)

FOREIGN PATENT DOCUMENTS

| | | |
|---|---|---|
| EP | 0165 600 B1 | 12/1985 |
| EP | 0 165 660 A2 | 12/1985 |
| EP | 0 636 976 B1 | 2/1995 |
| EP | 0 636 976 A1 | 2/1995 |
| EP | 0 652 516 A1 | 5/1995 |
| EP | 0702 239 A3 | 3/1996 |

(List continued on next page.)

Primary Examiner—Thomas Lee
Assistant Examiner—Thuan Du
(74) Attorney, Agent, or Firm—Lisa K. Jorgenson; James H. Morris

(57) ABSTRACT

A system and method for communicating with an integrated circuit is provided that allows an integrated circuit to communicate debugging information and system bus transaction information with an external system. The system may include an interface protocol that provides flow control between the integrated circuit and the external system. The system may include a high-speed link and/or a JTAG link for communicating information. A link may be automatically selected by a debug circuit, or selected by an on-chip device or external system. The high-speed link enables real-time collection of trace information. Links may be memory-mapped, such that on-chip devices and other devices attached to the system bus may access the external system. The high-speed link may also operate at a rate which is integrally coupled with a rate of the processor or system bus. Further, the high-speed link may be adapted to change speeds in response to a change in operating speed of the system bus or processor. The JTAG interface may utilize standard JTAG components and instructions such that external devices such as debug adaptors adopting these components and instructions may be re-used for different integrated circuit types. Information transmitted over the JTAG or high-speed link may be compressed to optimize available bandwidth of the links. Also, processor control signals can be transferred through links that allow an external system to manipulate and monitor operation of the processor and its associated modules.

19 Claims, 16 Drawing Sheets

U.S. PATENT DOCUMENTS

| | | | |
|---|---|---|---|
| 5,596,734 A | 1/1997 | Ferra ........................... | 395/825 |
| 5,598,551 A | 1/1997 | Barajas et al. ............... | 395/484 |
| 5,606,566 A | 2/1997 | Whetsel ...................... | 371/22.3 |
| 5,608,881 A | 3/1997 | Masumura et al. .......... | 395/306 |
| 5,613,153 A | 3/1997 | Arimilli et al. .............. | 395/821 |
| 5,627,842 A | 5/1997 | Brown et al. ............... | 371/22.3 |
| 5,657,273 A | 8/1997 | Ayukawa et al. ...... | 365/189.01 |
| 5,682,545 A | 10/1997 | Kawasaki et al. ........... | 395/800 |
| 5,704,034 A | 12/1997 | Circello ................. | 395/183.14 |
| 5,708,773 A | 1/1998 | Jeppesen, III et al. .. | 395/183.06 |
| 5,724,549 A | 3/1998 | Selgas et al. ................ | 395/468 |
| 5,737,516 A | 4/1998 | Circello et al. ......... | 395/183.14 |
| 5,751,621 A | 5/1998 | Arakawa ............... | 364/748.07 |
| 5,768,152 A | 6/1998 | Battaline et al. ........ | 364/551.01 |
| 5,771,240 A | 6/1998 | Tobin et al. ................. | 371/22.1 |
| 5,774,701 A | 6/1998 | Matsui et al. ............... | 395/556 |
| 5,778,237 A | 7/1998 | Yamamoto et al. .... | 395/750.04 |
| 5,781,558 A | 7/1998 | Inglis et al. ................. | 371/21.1 |
| 5,796,978 A | 8/1998 | Yoshioka et al. ........... | 395/416 |
| 5,828,825 A | 10/1998 | Eskandari et al. ...... | 395/183.03 |
| 5,832,248 A | 11/1998 | Kishi et al. .................. | 395/376 |
| 5,835,963 A | 11/1998 | Yoshioka et al. ........... | 711/207 |
| 5,838,692 A * | 11/1998 | Tobin ........................... | 600/520 |
| 5,848,247 A | 12/1998 | Matsui et al. ............... | 395/284 |
| 5,860,127 A | 1/1999 | Shimazaki et al. .......... | 711/167 |
| 5,862,387 A | 1/1999 | Songer et al. ............... | 395/728 |
| 5,867,726 A | 2/1999 | Ohsuga et al. .......... | 395/800.32 |
| 5,884,092 A | 3/1999 | Kiuchi et al. ........... | 395/800.35 |
| 5,896,550 A | 4/1999 | Wehunt et al. .............. | 395/846 |
| 5,918,045 A | 6/1999 | Nishii et al. ................. | 395/584 |
| 5,930,523 A | 7/1999 | Kawasaki et al. ...... | 395/800.32 |
| 5,930,833 A | 7/1999 | Yoshioka et al. ............ | 711/210 |
| 5,944,841 A | 8/1999 | Christie ........................ | 714/38 |
| 5,950,012 A | 9/1999 | Shiell et al. ................. | 395/712 |
| 5,953,538 A | 9/1999 | Duncan et al. .............. | 395/842 |
| 5,956,477 A | 9/1999 | Ranson et al. ......... | 395/183.06 |
| 5,978,874 A | 11/1999 | Singhal et al. .............. | 710/107 |
| 5,978,902 A | 11/1999 | Mann .......................... | 712/227 |
| 5,983,017 A | 11/1999 | Kemp et al. ................. | 395/704 |
| 5,983,379 A | 11/1999 | Warren ........................ | 714/727 |
| 6,185,692 B1 * | 2/2001 | Wolford ....................... | 710/31 |
| 6,292,908 B1 * | 9/2001 | Arimilli et al. ............... | 714/39 |
| 6,332,094 B1 * | 12/2001 | Gorman ....................... | 600/520 |
| 6,363,175 B1 * | 3/2002 | Scheirer et al. .............. | 382/232 |

FOREIGN PATENT DOCUMENTS

| | | |
|---|---|---|
| EP | 0 702 239 A2 | 3/1996 |
| EP | 0 720 092 A1 | 7/1996 |
| EP | 0 933 926 A1 | 8/1999 |
| EP | 0 945 805 A1 | 9/1999 |
| EP | 0 959 411 A1 | 11/1999 |
| JP | 8320796 A | 12/1996 |
| JP | 8329687 A | 12/1996 |
| JP | 9212358 A | 8/1997 |
| JP | 9311786 A | 12/1997 |
| JP | 10106269 A | 4/1998 |
| JP | 10124484 A | 5/1998 |
| JP | 10177520 A | 6/1998 |
| WO | WO98/13759 | 4/1998 |

* cited by examiner

SYSTEM AND METHOD FOR COMMUNICATING WITH AN INTEGRATED CIRCUIT

BACKGROUND OF THE INVENTION

1. Field of the Invention

The invention relates generally to communication protocols and interfaces, and more specifically, to a system and method for communicating with an integrated circuit.

2. Related Art

System-on-chip devices (SOCs) are well-known. These devices generally include a processor, one or more modules, bus interfaces, memory devices, and one or more system busses for communicating information. Because multiple modules and their communications occur internally to the chip, access to this information is generally difficult when problems occur in software or hardware. Thus, debugging on these systems is not straightforward. As a result of development of these SOCs, specialized debugging systems have been developed to monitor performance and trace information on the chip. Such systems typically include dedicated hardware or software such as a debug tool and debug software which accesses a processor through serial communications.

However, debugging an SOC generally involves intrusively monitoring one or more processor registers or memory locations. Accesses to memory locations are sometimes destructive, and a data access to a location being read from a debugging tool may impede processor performance. Similarly, accesses are generally performed over a system bus to the processor, memory, or other module, and may reduce available bandwidth over the system bus for performing general operations. Some debugging systems do not perform at the same clock speed as that of the processor, and it may be necessary to slow the performance of the processor to enable use of debugging features such as obtaining trace information. By slowing or pausing the processor, some types of error may not be reproduced, and thus cannot be detected or corrected. Further, accurate information may not be available altogether due to a high speed of the processor; information may be skewed or missing.

Some systems include one or more dedicated functional units within the SOC that are dedicated to debugging the processor, sometimes referred to as a debug unit or module. However, these units affect the operation of the processor when obtaining information such as trace information. These units typically function at a lower speed than the processor, and thus affect processor operations when they access processor data. For example, when transmitting trace information off-chip, trace information may be generated at a rate that the debug module can process or transmit off-chip, and the processor must be slowed to avoid losing trace information. The debug module relies upon running debug code on the target processor itself, and this code is usually built into the system being debugged, referred to as the debugee. Thus, the presence of the debug code is intrusive in terms of memory layout, and instruction stream disruption.

Other debugging systems referred to as in-circuit emulators (ICEs) match on-chip hardware and are connected to it. Thus, on-chip connections are mapped onto the emulator and are accessible on the emulator which is designed specifically for the chip to be tested. However, emulators are prohibitively expensive for some applications because they are specially-developed hardware, and do not successfully match all on-chip speeds or communications. Thus, emulator systems are inadequate. Further, these systems generally transfer information over the system bus, and therefore necessarily impact processor performance. These ICEs generally use a proprietary communication interface that can only interface with external debug equipment from the same manufacturer.

Another technique for troubleshooting includes using a Logic State Analyzer (LSA) which is a device connected to pins of the integrated circuit that monitors the state of all off-chip communications. LSA devices are generally expensive devices, and do not allow access to pin information inside the chip. In sum, there are many systems which are inadequate for monitoring the internal states of a processor and for providing features such as real-time state and real-time trace in a non-intrusive manner.

Further, some debugging circuits make use of an interface referred in the art to as a JTAG (Joint Test Action Group) interface defined by IEEE 1149.1-1990 standard entitled Standard Test Access Port and Boundary-Scan Architecture. The specification was adopted as an IEEE standard in February 1990, and JTAG interfaces are commonly provided in integrated circuit systems. IEEE standard 1149.1 allows test instructions and data to be serially loaded into a device and enables the subsequent test results to be serially read out. JTAG interfaces are provided to allow designers to efficiently access internal parameters of integrated circuits to perform a boundary scan test on an integrated circuit (IC) device to detect faults in the IC. Boundary scan testing is well-known in the art of IC and ASIC development.

Every IEEE standard 1149.1-compatible device includes an interface having four additional pins—two for control and one each for input and output serial test data. To be compatible, a component must have certain basic test features, but IEEE standard 1149.1 allows designers to add test features to meet their own unique requirements.

Some systems provide a method by which a JTAG interface associated with an integrated circuit may be reused to transfer debugging information. In one approach, a single JTAG instruction is used to place the JTAG port into a mode whereby JTAG pins are reused to form a link between the integrated circuit and another system. Signals on the JTAG pins in this mode are not conformant with the IEEE 1149.1 JTAG standard, nor do they obey any of the JTAG standard rules and thus cannot be connected to a standard JTAG device. In addition, the JTAG interface is a low-speed link, and is generally not capable of transferring information at a high rate of speed (in the MBit/s range of transmission and higher). Thus, an improved interface is needed for accessing an integrated circuit.

SUMMARY OF THE INVENTION

These and other drawbacks of conventional debug systems are overcome by providing an interface and protocol for communicating with an integrated circuit.

Further, a high-speed link is provided for obtaining information from an integrated circuit. Because the interface operates at a high rate of speed, real-time collection of trace information is possible. Further, the trace information transferred includes all of the information that an external system would use for debugging a processor. Also, the link may be memory-mapped such that an on-chip processor or other device associates with the integrated circuit may execute software located on the external system and on-chip devices may perform system bus transactions with a memory or storage device of the external system. In one aspect, the system includes an interface protocol that provides flow control between an integrated circuit and external system without requiring additional flow control pins.

According to another aspect of the invention, trace information communicated over the interface includes both address information and message information. In another aspect, the trace information includes timing information.

In another aspect of the invention, the link operates at a rate which is proportional to an operating rate of a processor system bus. In one aspect, the rate of the link changes as the rate of the system bus changes. Thus, debug information generated on-chip will not overwhelm the transmission capabilities link because the link speed is derived from the internal system bus rate.

In another aspect of the invention, an external system is capable of stopping, starting, and resetting the processor through the external link. In one embodiment, signals are provided for controlling the processor. In another embodiment, the external system is capable of writing to a register in a debug circuit to effect processor control.

In another aspect, the trace information may be compressed by the trace system. By compressing information, trace information is preserved for transmission over lower-bandwidth links and maximizes on-chip trace storage. For example, trace information may be compressed by compressing timestamp and address information. Further, trace information may be compressed by omitting duplicate types of information, such as one trace packet of a particular operation type. Also, information may be filtered by predefining criteria upon which trace information is generated. By filtering information and eliminating duplicate information on-chip, bandwidth requirements of links to external systems and on-chip storage requirements are reduced.

In another aspect, request information originating from an external device may also be compressed. In one embodiment, it is realized that the external system transmits only request messages, so that a message type field may be omitted. In another embodiment, transmission of information is minimized by transmitting, before a data message, status information indicating that a valid message is available to be transmitted.

In another aspect, a standard JTAG interface is used, and therefore, standard off-the-shelf JTAG components and JTAG commands may be implemented. Also, external systems such as debug adapter boards using JTAG components and the JTAG protocol may be reused for debugging different types of integrated circuits utilizing standard JTAG features.

According to another embodiment, both a JTAG interface and high-speed interface are available, and in one embodiment, both the interfaces implement an identical messaging protocol. Thus, because both interfaces utilize an identical messaging protocol, the amount of hardware in the integrated circuit may be reduced. Further, because the same messaging structures are used, the same functionality is provided for both interface types. Also, a mechanism may be provided wherein a link is selected automatically by the debug circuit or other device associated with integrated circuit 101, or is selectable by a user operating the external system.

According to another aspect of the invention, a message format is provided that minimizes the amount of information to be transferred over a JTAG interface. In particular, information regarding whether a message is available is transmitted before data information within a shift register.

These an other advantages are provided by a method for communicating between a debug circuit of an integrated circuit and an external system. The method comprises steps of sending a first request message; receiving a second request message, said second request message indicating that a receive processor may receive another request message; and sending a third request message. According to one embodiment, messages are transmitted over an output data path and are received over an input data path wherein the input and output paths operate independently from one another. According to another embodiment, the output data path is wider than the input data path.

The input data path may be, for example, 1 bit wide. According to one embodiment, the output data path is 4 bits wide.

According to another embodiment, the steps of sending request messages includes sending a start of message indication; and sending an end-of-message indication. According to another aspect, the request messages are system bus request messages.

According to one embodiment, contents of the request messages are identified and specify the response required to each request message. According to another embodiment, the system bus request messages originate from one or more devices coupled to a system bus associated with the integrated circuit.

According to another aspect, input data of an input message is provided in phase with an input clocking signal. According to one embodiment, output data of an output message is provided that is in phase with an output clocking signal. According to yet another embodiment, the third request message is located in a buffer, and is transmitted in response to receiving the second request message. According to another aspect, an output transmission clock used to clock output data is determined from an internal system bus clock. According to one embodiment, a programmable divider determines the output transmission clock frequency.

According to another embodiment, the programmable divider is programmed by a system external to the integrated circuit. According to another aspect, the output transmission clock is an integral frequency of the system bus clock. According to one embodiment, the system clock is dynamically changed to conserve power. According to another embodiment, the external system issues a command to transfer the processor from a standby state into an operating state. According to another aspect, the external system monitors a status indicator to determine if the processor is operating normally. According to one embodiment, the external system waits a predetermined amount of time to allow the processor to stabilize. According to another embodiment, the external system may perform one of either waiting a predetermined amount of time to allow the processor to stabilize; and monitoring a status indicator to determine if the processor is operating normally. According to another aspect of the invention, the external system delays sending of requests until the processor is operating normally.

According to one embodiment, an input message is compressed by omitting a type field.

According to another embodiment, an output message is a variable-length message determined by the contents of the message. According to another aspect, an output message is not dependent on debug adapter buffer status. According to one embodiment, the debug circuit indicates, in a bit of the output idle word, whether the receive buffer of the module is empty. According to another embodiment, output messages are one of trace messages and system bus transactions. According to another aspect, an idle word separates two output messages. According to one embodiment, the system bus transaction is a request to an address space of the external system.

According to another embodiment, a message type field of a trace message indicates that the trace message is at least one of, a trigger trace message type; and a background trace message type.

According to another aspect, the request to the address space of the external system is at least one of the group of reading from a memory address, storing to a memory address; and writing to a memory address and returning a previous value of the memory address.

According to another aspect, a method is provided for communicating between an integrated circuit and an off-chip device. The method comprises steps of transmitting a message off-chip at a transmission frequency proportional to an on-chip at a transmission frequency proportional to an on-chip system bus transmission frequency and automatically adjusting the transmission frequency in response to a change in bus transmission frequency.

According to another aspect of the inventions, an integrated circuit device is provided, the circuit comprising a first interface for communicating debugging information to an external device, a second interface for communicating debugging information to the external device, means for selecting at least one of first and second interfaces; and means for translating request from a system bus associated with the integrated circuit to at least one of the first and second interfaces.

According to another aspect, an integrated circuit is provided comprising an interface for communicating information to an external device and having an output buffer configured to store a plurality of data bits representing an output data message, the interface providing an indication to the external device that a data message is available to be transmitted to the external device.

According to another aspect of the invention, a data shift register is provided which is adapted to communicate message information. The shift register comprises a plurality of stored locations; and means for shifting a plurality of status bits, at least one of which indicating whether an output message stored in said storage locations is available to be transmitted, wherein said means shifts only the status bits out of the data shift register.

According to another aspect, an integrated circuit is provided comprising a communication circuit having a communication link coupling the integrated circuit and an external system, wherein the communication circuit is configured to transmit at least one of a group of messages including a request message including a system bus command for accessing a location in a memory of the external system; a response message including data produced in response to said system bus command; and a trace message.

Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

BRIEF DESCRIPTION OF THE DRAWINGS

This invention is pointed out with particularity in the appended claims. The above and further advantages of this invention may be better understood by referring to the following description when taken in conjunction with the accompanying drawings in which similar reference numbers indicate the same or similar elements.

In the drawings.

DETAILED DESCRIPTION

Figure 1:
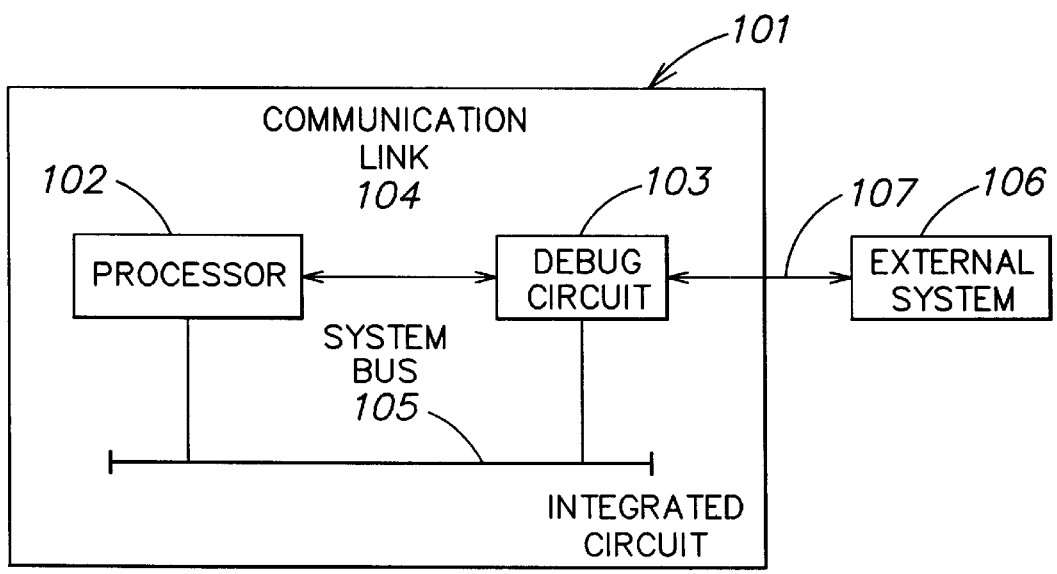
FIG. 1 is a block diagram of an integrated circuit in accordance with one embodiment of the invention.

One embodiment of the invention is described with particularity with respect to FIG. 1. FIG. 1 shows a block diagram of an integrated circuit device 101, or system-on-chip (SOC) mentioned above. This circuit may include a processor 102 and debug circuit 103 interconnected by a system bus 105. System bus may be a conventional bus, packet switch, or other communication medium used to communicate operating information between modules of device 101. Operations such as reads, writes, swaps, and the like are typical operations that are performed between modules. Other operations may also be performed.

Processor 102 is a device which is adapted to read and execute program code including one or more processor instructions, and to perform operations on data. Processor 102 may read data from a number of data sources, and write data to one or more data stores (not shown). These data stores may include Random Access Memory (RAM), a computer hard disc accessible through a hard disc controller, storage accessible over one or more communication links, or any entity configured to store data. These storage entities may be accessible directly on system bus 105 or may be accessible through an external communication link 107. Processor 102 may be a general purpose processor, such as a processor running in a general purpose computer system or may be a specialized processor adapted for a special purpose. It should be understood that any type of processor and any number of processors may be used.

In one embodiment of the invention, a communication link 104 couples processor 102 to debug circuit 103, and is separate from system bus 105. Link 104 is configured to transfer debug information from processor 102 to debug circuit 103, and to transfer state and processor control information from the debug circuit 103 to processor 102. It should be understood that one or more processors may be serviced by debug circuit 103, and may be connected by one or more links 104 or through one or more system busses 105.

In one aspect of the invention, trace information is received by debug circuit 103, where it is processed and stored or transmitted to an external system 106 through one or more communication links 107. The terms link and interface are used as equivalent terms and shall be used interchangeably hereinafter.

In accordance with another embodiment of the invention, trace information is compressed prior to transmitting the trace information off-chip. In particular, instruction address, operand addresses, and timestamp information may be compressed to save storage space, and to reduce an amount of bandwidth needed to transfer the trace information to an external system 106. According to another embodiment, trace information is stored on-chip and/or in a memory associated with integrated circuit 101. By compressing trace information prior to storing it, use of on-chip storage and/or system memory is minimized.

In another aspect, communication link 107 may be used to transfer system bus transactions to and from external system 106. For example, the system bus transactions may include read, write, and swap transactions that are used to perform operations between addressable modules located on system bus 105. Other bus transactions may be used. A communication interface of debug circuit 103 attached to link 107 may be memory-mapped, such that on-chip devices may perform system bus transactions to external system 106. Because on-chip devices can access external system 106 in this manner, software code may be stored in external system 106 and executed by processor 102 over link 108. Similarly, external device communication link 107 may also initiate system bus transactions to effect operations on on-chip devices other modules coupled to system bus 105. According to one aspect of the invention, a plurality of addressable modules such as processors are configured to operate on the system bus, and communication link 107 allows external system 106 to access these addressable modules.

Link 107 may include separate input and output interfaces which provide communication with an external system 106. The links 107 may be any type of medium, width or transmission speed. For example, link 107 may also have an input data path 1-bit wide and an output data path 4-bits wide. The widths of the input and output data paths may be increased to meet the debugging bandwidth needs of different implementations and applications.

According to various embodiments of the invention, link 107 provides:

Access by the external system 106 to the processor physical address map (RAM, ROM, on-chip devices, external-devices).

Processor-originated access to an address space mapped over the link 107 into external system 106 memory. This allows debugging software such as a target debug agent (or any other software code) to be executed on the processor 102 without requiring any external RAM or ROM, and thus enables use of processor 102 without a traditional monitor ROM used to hold on-chip debug software.

Control of the processor 102 via one or more memory-mapped registers.

Streaming operations for processor 102 and bus trace information to support non-intrusive trace functions. Debug circuit gathers information from the processor 102 and the on-chip busses to be copied to a specified address area in the physical memory map, such as memory associated with integrated circuit 101 (such as a RAM) or link 107. Link 107 is normally connected to an interface in an adapter device of external system 106 to provide code download and debug facilities. Interface 107 can also be connected to specialized hardware debug systems such as logic analyzers to provide more complex functions including triggering.

Link 107 may operate using two protocol levels to communicate to an external device 106:

A low-level protocol which provides start-of-message indication, end-of-message indication and flow control. At this protocol level, message input and message output can be independent such that messages can flow in both directions at the same time.

A higher-level messaging protocol which identifies the message contents and specifies the response required to each request. Certain message types, such as trace messages from processor 102 may be output-only and thus require no response from external system 106. It should be understood that one or more protocols may be used to implement the features described herein, and the invention is not limited to the particular implementations disclosed.

Figure 2:
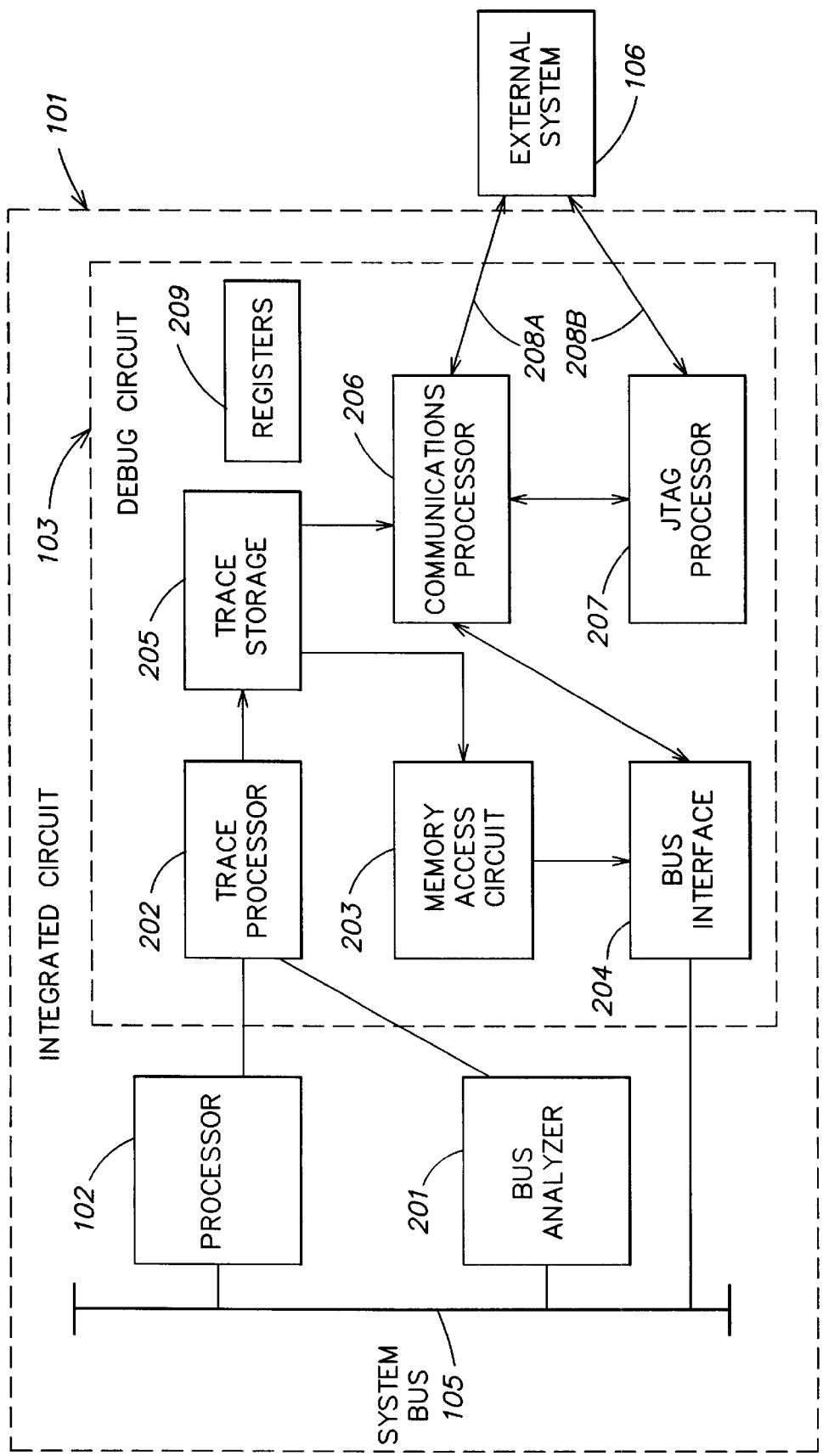
FIG. 2 is a detailed block diagram of an integrated circuit in accordance with one embodiment of the invention.

FIG. 2 shows a more detailed diagram of a system according to one embodiment of the present invention. Integrated circuit 101 includes a processor 102, a bus analyzer 201, and a debug circuit interconnected by system bus 105. Bus analyzer 201 provides analysis of bus transactions occurring on system bus 105, and provides control signals and trace information to debug circuit 103. It should be understood that any type of circuit could be used that provides information to be transmitted to external system 106. Integrated circuit 101 may also have one or more communications links 208A, 208B to external system 106.

Debug circuit 103 may receive trace and/or state information from processor 102 and bus analyzer 201 and may include a trace processor 202 which receives the trace and/or state information and formats trace messages and stores them in trace storage unit 205. Trace processor 202 may be, for example, a circuit, processor, or software process that can receive information and generate trace messages. Trace storage 205 may also include a FIFO buffer for receiving trace messages. A trace system may be used such as one or more of the trace systems described in the U.S. patent application Ser. No. 09/410,558 entitled APPARATUS AND METHOD FOR STORING TRACE INFORMATION by D. Edwards et al., filed Oct. 1, 1999, and incorporated herein by reference in its entirety.

Trace messages may be stored in a memory associated with integrated circuit 101 by memory access circuit 203. Memory access circuit 203 may utilize a bus interface 204 which sends system bus messages 105 to a memory associated with integrated circuit 101. Bus interface 204 may perform bus transactions such as reads, writes, and swaps to addresses within an address space of an addressable device located through system bus 105, such as an address of a memory location in a memory device. It should understood that bus interface 204 may access any device associated with integrated circuit 101, including additional processors, or other devices, and may perform other types of bus transactions.

Debug circuit 103 may include a communications processor 206 that controls communication to external system 106 and provides access to an address space of external system 106 through bus interface 204. That is, devices such as processor 102 may initiate bus transactions over system bus 105 to an address in an address space mapped to external system 106. Communications processor 206 may receive requests from bus interface 204, and generate responses to a device located on the system bus through bus interface 204.

Communications processor 206 may also provide the ability to automatically choose a transmission interface 208A, or 208B or may be controlled by external system 106 to choose one or more of the interfaces 208. For example, selection of an interface by external system 106 may be performed by writing a value to a register 209 in circuit 103. According to one embodiment, when register 209 contains a command indicating the use of JTAG interface 208B, interface 208A is deactivated and interface 208B is used to receive and transmit messages.

As discussed above, debug circuit 103 may include a JTAG interface 208B that is configured to communicate trace and bus transaction information between debug circuit 103 and external system 106. To facilitate a transfer of information over the JTAG interface 208B, circuit 103 may include a JTAG processor 207 that controls JTAG interface 208B and communication of data to external system 106.

Figure 3:
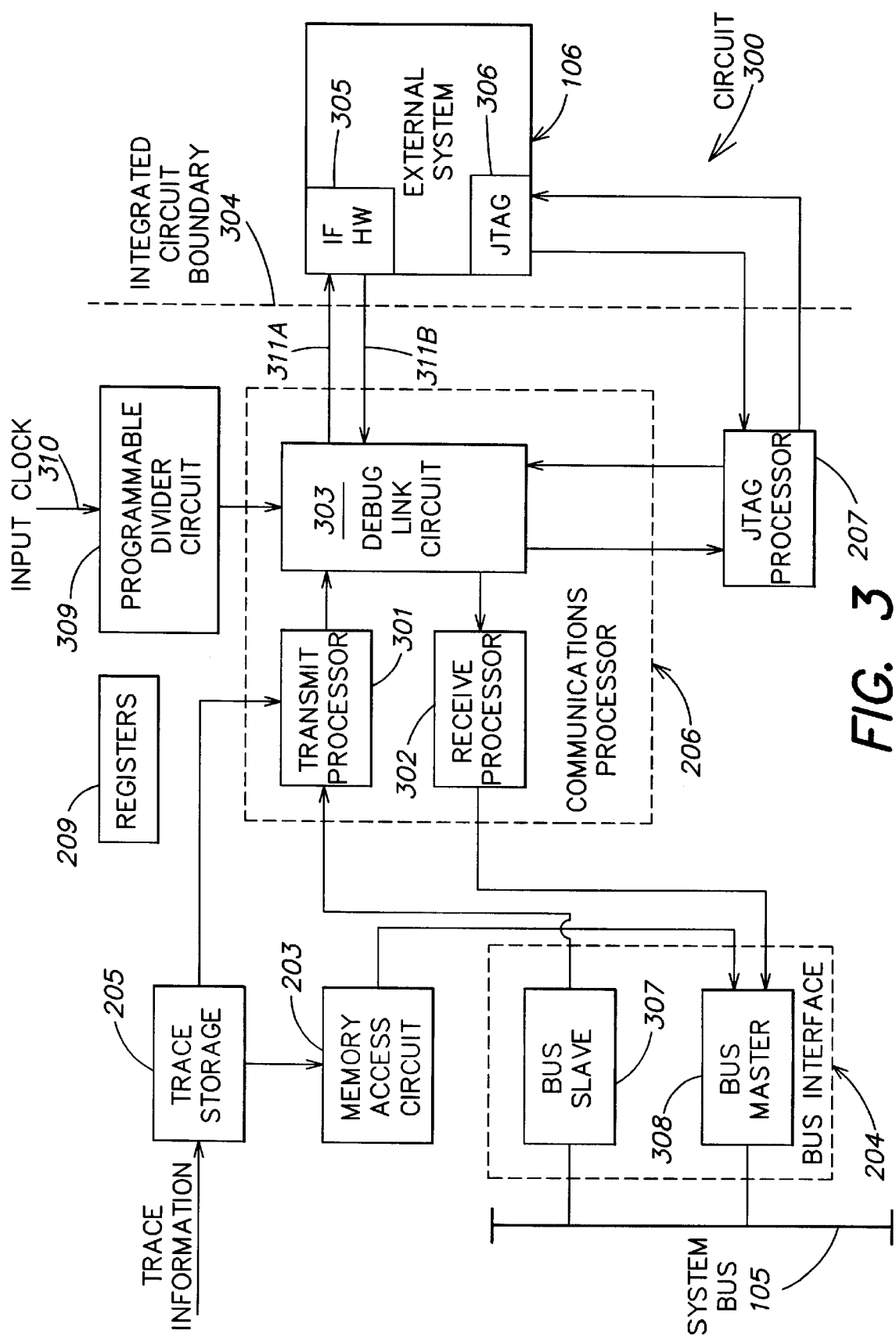
FIG. 3 shows a system for transferring information to an external system.

FIG. 3 shows a more detailed diagram of a circuit 300 in accordance with one embodiment of the invention. An integrated circuit may include a bus interface 204 that functions as both a bus slave 307 and a bus master 308. That is, bus interface 204 may be capable of initiating and controlling a communication on a bus. Bus slave 307 is a bus device that can only act as a receiver of requests received on bus 105. Bus interface 204 may communicate using a bus protocol, which is a set of rules which define bus signals asserted by master and slave devices in each phase of a bus operation. Bus protocols are well known in the art, and it should be understood that the invention may be utilized with any type of bus or any other type of integrated circuit communication mechanism.

Communications processor 206 may include a transmit processor 301 which is responsible for receiving trace information stored in trace storage 205 for transmission to external system 106. Trace information is generally formatted as discrete trace messages transmitted to external system 106. Trace messages include one or more states of processor 301, such as program counter information and the like. Also, trace messages are typically unsolicited messages sent to external system 106, and are sent when a particular condition occurs within processor 102 or any other device associated with integrated circuit 101. In particular, transmit processor 301 may transmit requests received from bus slave 307 to debug link circuit 303, and these requests may be transmitted to external system 106.

Communication processor 206 also includes a receive processor 302 which receives information from a debug link circuit 303. According to one embodiment of the invention, transmit processor 301 and receive processor 302 operate independently. That is, there is no interaction between processor 301 and processor 302 to coordinate the transmission and reception of messages.

Debug link circuit 303 may provide a high speed interface 309 which includes separate transmit and receive paths 309A and 309B, respectively. According to one embodiment, transmit path 309A allows high-bandwidth data to pass to interface hardware 305 of external system 106. For example, path 309A may be a 4-bit wide path that is capable of transmitting data at a comparable speed to a frequency of a system bus, such as 1 Mbit/second and higher. According to one embodiment, transmit path 309A has a data transmission rate of 100 Mbit/s.

Path 309B may also be used to transfer information from external system 106 to debug link circuit 303. Such information may include responses from external system 106. As discussed above, system 106 may also include a JTAG interface 306 that conforms to IEEE standard 1149.1-1990. Integrated circuit 101 includes a JTAG processor 207 that communicates information such as system bus transactions and trace information over integrated circuit boundary 304 to a JTAG interface 306 in system 106.

Debug circuit 103 may initiate two types of transactions over external link 107; bus transactions and transmission of trace messages. Messages associated with bus transactions are referred to as bus messages, hereinafter referred to as DBUS messages. These DBUS messages are typically transmitted when an external system 106 reads or writes to an address space of integrated circuit 101, and when the integrated circuit 101 or other bus master on system bus 105 reads or writes to an address space in external system 106. Also, another type of transaction includes transmitting trace messages from debug circuit 103 (these messages are hereinafter referred to as DTRC messages) to external system 106. According to one embodiment of the invention, the protocol which transmits these transaction messages is the same, regardless of the width of the data path in link 107 or the type of data paths used.

A DBUS message is sent from integrated circuit 101 whenever the processor 102 or other bus master issues requests to a debug circuit 103 target address space. For each request message sent from integrated circuit 101, there is a corresponding response message sent back from the external system 106. According to one embodiment, the DBUS request message has the same format as a system bus message, but includes a header to identify it as a DBUS message.

A DBUS request message 401 may be defined that supports the following commands:

load command (read from a memory address);

store command (write to memory address);

swap command (write to a memory address and return a previous value which is stored at the memory address); and other commands, such as cache coherency commands that may be available. It should be understood that any commands may be implemented.

Figure 4:
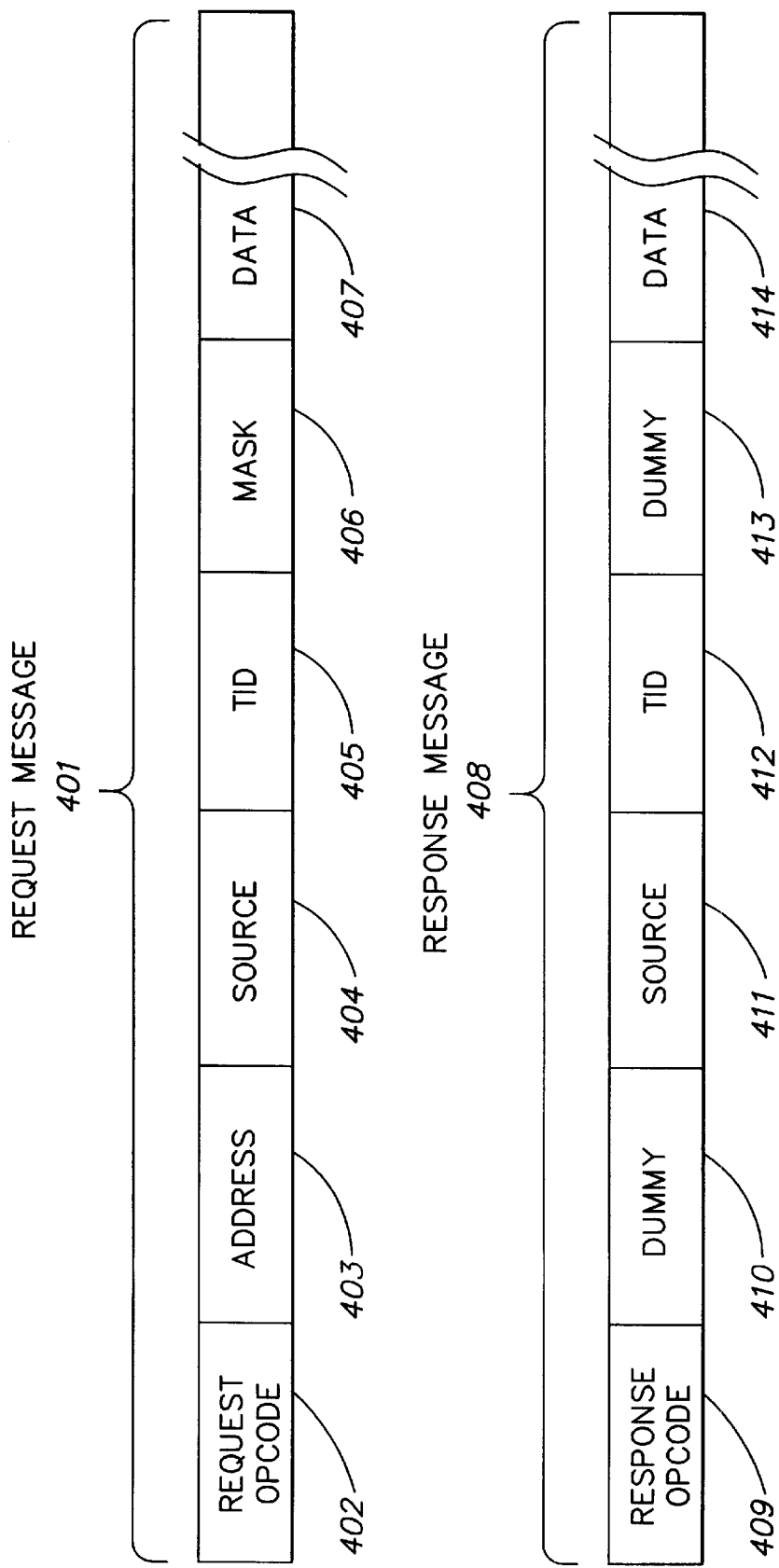
FIG. 4 shows data formats of request and response messages sent by an external system.

As shown in FIG. 4, a DBUS request message 401 may have a number of fields. Request opcode 402 may include data which defines the contents of the message 401. For example, request opcode 402 may include information which identifies whether the transaction is a bus request or a bus response message. Address 403 may be, for example, an address of an addressable range of a device on system bus 105. In one aspect of the invention, a portion of address field 403 may identify a destination system bus 105 device. In the remainder of the address field, source field 404 identifies the source of the request. When generating a response, a system may ensure that the value in the source field of the response matches the source field of the original request. Message 401 may also include a transaction identifier (TID) field 405 that identifies the transaction. Mask 406 may define data which is significant within a particular word of data. In one embodiment, field 406 may have no meaning for transactions with multiple words. Data field 407 contains the actual data that will be written to a memory location defined by address 403.

External system 106 may also generate a response message 408 in response to a received request message 401, and response message 408 may also include a number of data fields. For example, response message 408 may include response opcode 409 that identifies message 408 as a response message. Message 408 may also include one or more dummy fields 410, 413 which contains no useful information but is provided such that DBUS requests and responses have the same field structure and size. Dummy fields 410, 413 are not required, but may be used to provide an equivalent message structure for request and response packets, and thus on-chip hardware may be simplified. Message 408 may include source 411 and transaction identifier 412 fields similar in function to the fields of message 401. Further, response message 408 may not require a mask field 406 in the response (a mask is applied to data of a request message), therefore a dummy field 413 can be inserted. Response message 408 may include data 414 which may be data that was stored at a memory location defined by address 403.

Figure 5:
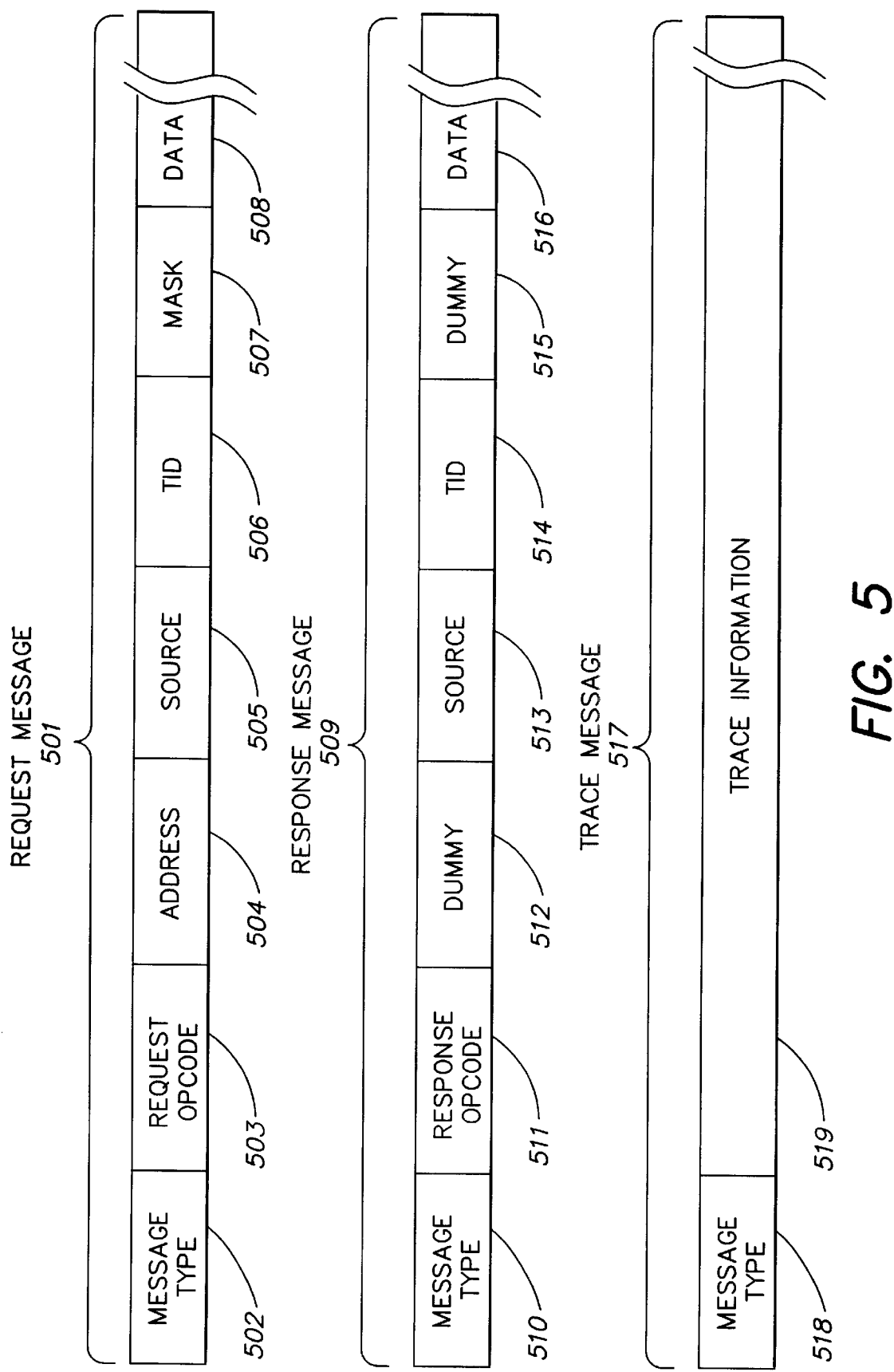
FIG. 5 shows data formats of request, response, and trace messages sent by an integrated circuit.

FIG. 5 shows request 501, response 509, and trace 517 messages that may be transmitted by a debug circuit 103 to external system 106. Request message 501 may include a message type field 502, request opcode 503, address 504, source 505, TID 506, mask 507, and data 508 fields which are similar in format and function to similarly-named fields of request message 401. Further, debug circuit 103 may be configured to send a response message 509 to an external system 106, response message 509 including message type 510, response opcode 511, dummy 512, source 513, TID 514, dummy 515, and data 516 fields similar in form and function to similarly-named fields of response message 408. Additionally, debug circuit may be configured to transmit trace messages 517 (DTRC messages) having state information associated with processor 102. In one embodiment, there may be two types of DTRC messages:

- trigger trace messages indicating that external system 106 should perform one or more actions based on receiving the trigger trace message; and
- background trace messages which are information-only trace messages.

These different types of trace messages may be distinguished by a message type field 518, and may contain similar format of trace information data 519. For example, a trigger trace message may correspond to a value of the message type field 518==0b011 and background trace messages may correspond to a value of the message type field 518==0b010. Trace messages 517 may also be transmitted outwardly only from debug circuit 103 and require no response from external system 106.

As discussed above, trace information may include state information of processor 102. For example, a watchpoint channel may be defined in processor 102 that "watches" for a particular state condition in processor 102 and triggers an event signal to debug circuit 103 when the condition occurs. A watchpoint channel may include a mechanism by which a data value associated with an execution pipeline in processor 102 may be matched to one or more predetermined data values. For example, predetermined data values stored in registers associated with processor 102 may be compared with data values in processor 102 including instruction addresses, instruction value addresses, operand addresses, performance counters, event counters, and the like.

When matched, a controller associated with the watchpoint channel may provide an event signal to debug circuit 103 through communication link 104. The signal may take the form of state bits indicating particular watchpoint channel states within processor 102. Also, state bit values corresponding to watchpoint channels may be combined together to produce other state bit values to be used in different debugging operations by debug circuit 103, and these other state bit values may also be communicated to debug circuit 103.

In a similar manner, debug circuit 103 may provide a number of state values to processor 102 for use in debugging operations. In particular, debug circuit 103 may provide a number of bit values that operate as preconditions for watchpoint channels to trigger particular watchpoint channel events in processor 102. These watchpoint channel events may provide information to be included in a trace message, or may determine a type of trace message generated.

Further, other modules associated with debug circuit 103 may include watchpoint channels and may generate state information to be included in trace messages. For example, a circuit operatively connected to the system bus, referred to as a bus analyzer, may analyze bus transactions by comparing values stored in registers associated with the bus analyzer to request and response messages, and may provide state information or control signals to one or more modules. These and other features of watchpoint channels are described more fully in the co-pending U.S. patent application Ser. No. 09/410,607 entitled MICROCOMPUTER DEBUG ARCHITECTURE AND METHOD, by D. Edwards, et al., filed Oct. 1, 1999, incorporated by reference in its entirety.

Debug circuit 103 may transmit trace messages in accordance with a trace message format. Table 1 below shows an example format of a general trace message.

TABLE 1

General Trace Message Fields

| Field | Size | Header Bit Positions | Description |
|---|---|---|---|
| Message Type | 3-bits | [0, 2] | Defines the basic contents of the debug message field values of 0b010 (DTRC background trace message) and 0b011 (DTRC trigger trace message) indicate the type of trace message. |
| Source Module | 3-bits | [3, 5] | Defines the on-chip source module which provides the information in the trace message.<br>Value - Description<br>0 - Processor watchpoint controller<br>1 - Bus Analyzer<br>2–7 - Reserved for watchpoint logic in additional processor cores or future accelerator modules. |
| Event Type | 5-bits | [6, 10] | Defines a watchpoint channel in the source module which generated the trace message. Values may identify watchpoint channels in the processor and Bus Analyzer. |
| Over Stall | 1-bit | [11] | This bit may have two meanings depending on whether the stall-mode register identifies a stall mode or a non-stall mode.<br>In stall mode, this bit is set when processor 102 was stalled for some indeterminate time prior to this trace message being generated because there was no space available in the trace storage unit 205 |

TABLE 1-continued

General Trace Message Fields

| Field | Size | Header Bit Positions | Description |
|---|---|---|---|
| | | | of the debug circuit. In non-stall mode, this bit is set to indicate that one or more trace messages before this one were discarded because there was no space available in trace storage 205. That is, in non-stall mode, this bit indicates that one or more trace messages were lost. |
| PC Absolute | 1-bits | [12] | Defines whether a program counter (PC) field contains a 4-byte absolute address or a 1- or 2-byte relative address. A relative address is the signed offset from the most recent PC value sent in a previous trace message (of any type). Value - Description 0 - Relative address offset 1 - Absolute 4-byte address |
| Other | 4-bits | [13, 15] | Specific for each watchpoint channel type. |
| Timestamp | 1-byte | N/A | This optional field may occur in the trace message when, for example, the watchpoint channel's action includes enable_trace_timestamp == 1. This value may be, for example, a one-byte value that specifies a number of timer increments since the last Reference trace message was generated. |
| ASID | 1-byte | N/A | This optional field may occur, for example, whenever the watchpoint channel if setup to match any ASID (address space identifier) that identifies a particular process executing on processor 102. When, for example, a watchpoint channel's pre-condition includes asid_enable == 1, then the ASID field does not appear in the trace messages. |
| PC | 1, 2 or 4 bytes | N/A | If the value of PC Absolute is '0', this field is a 1-byte or 2-byte compressed address as a signed offset from the most recent program counter value sent in a previous trace message (of any type). If the value of PC Absolute is '1', this field holds 4-byte absolute value of the program counter. |

Trace messages specific to a watchpoint channel type may be generated. For example, specific trace messages may be generated indicating a particular occurrence in processor 102, such as states triggering watchpoint channels. A patent application Ser. No. 09/410,558 entitled APPARATUS AND METHOD FOR STORING TRACE INFORMATION, by D. Edwards et al., filed Oct. 1, 1999, herein incorporated by reference, describes various formats of trace messages associated with different watchpoint channel types. It should be understood that any trace message format may be used and any status information may be communicated in trace messages.

Figure 6:
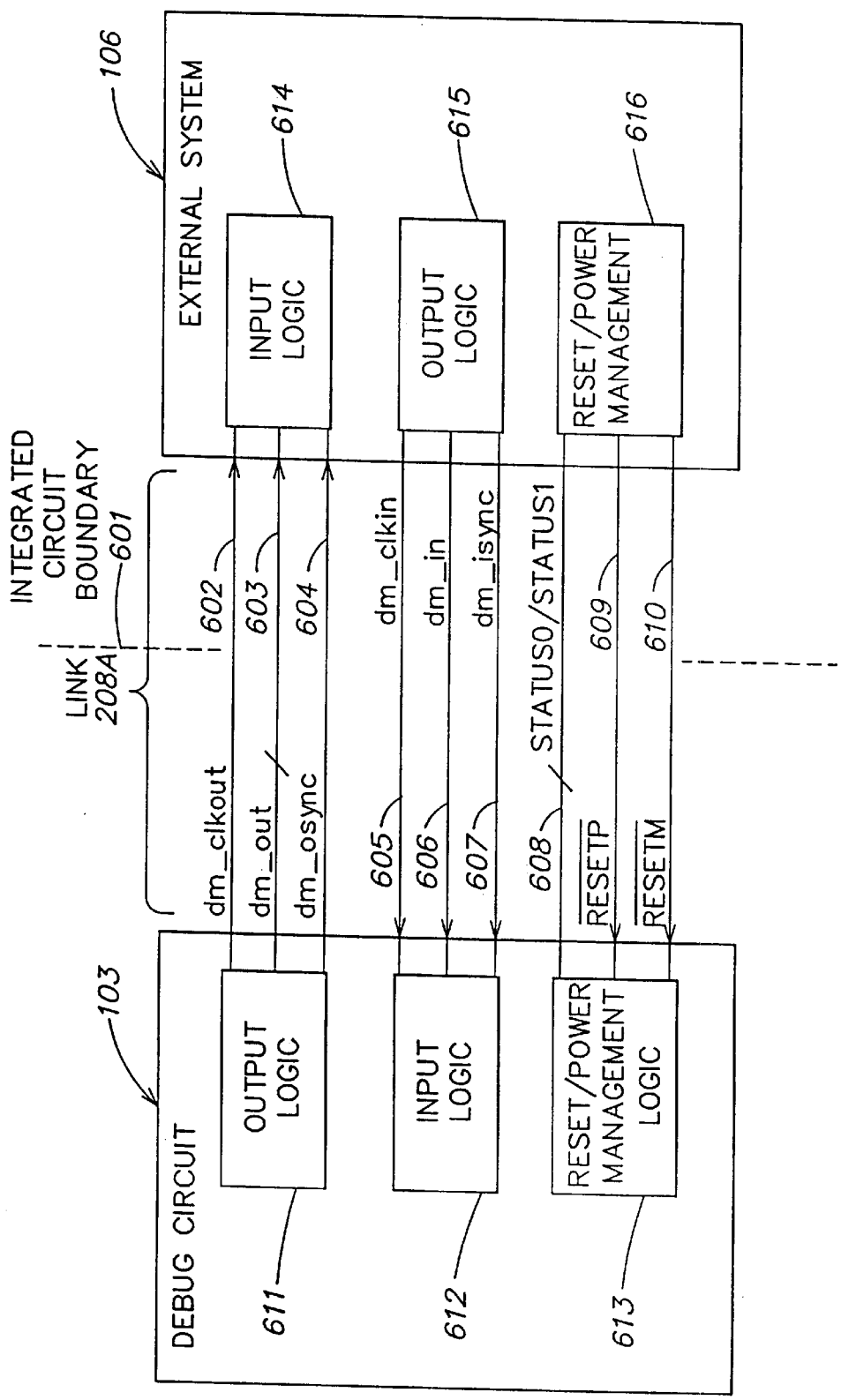
FIG. 6 shows one embodiment of an interface between a debug circuit and an external system.

FIG. 6 shows one embodiment of an interface 208A in accordance with one aspect of the invention. As shown, link 208A may include signals for output, input, and reset/power management of integrated circuit 101. In particular, debug circuit 103 of integrated circuit 101 may include output logic 611 which handles transmission of signals to input logic 614 of external system 106, such as those signals associated with transmitting data at integrated circuit 101. Debug circuit 103 may also include input logic 612 which accepts signals from output logic 615 of external system 106 such as those signals associated with receiving data at integrated circuit 101. Debug circuit 103 may also include reset/power management logic 613 that provides and accepts signals from reset power management 616.

In particular, debug circuit 103 may provide a number of signals to external system 106 across integrated circuit boundary 601. For example, circuit 103 may include a signal dm_out 603 which transmits an output data value from circuit 103. In one embodiment, dm_out 603 may be a 4-bit wide output path. The value of data on these pins may be synchronous to the rising edge of an output clock signal dm_clkout 602. The data value on these pins may also be valid whenever an output synchronization signal dm_osync 604 is low, apart from the first 4-bits of the output message, which are valid just prior to the falling edge on dm_osync (i.e., when it is high). Signal dm osync 604 may be a 1-bit output from circuit 103 that indicates to external when data is being transmitted, synchronous to the rising edge of dm_clkout 602. When high, signal 604 indicates either an output idle condition or the start of an output message transfer (i.e., transfer of the first 4-bits of the message). When low, dm osync 604 indicates the body of the messages being transferred (i.e., a falling edge indicates that dm_out 603 on the previous rising edge of dm_clkout was the first 4-bits of the output message).

Signal dm_clkout 602 may be a clock signal generated internally within integrated circuit 101 received by system 106 and used to clock received data signal dm_out 603. Valid dm_clkout 602 frequencies may, for example, range from DC to values including 100 MHz or more, depending on the configuration of programmable divider circuit 309.

STATUS0/STATUS1 signals 608 are used to indicate a power status of the integrated circuit such as being in normal operation, standby mode, sleep mode, or performing a scan-reset. These different states are discussed in detail below with respect to FIGS. 14–16. To interact with integrated circuit 101, external system 106 may monitor the STATUS0/STATUS1 608 signals when performing read or write operations to interface 208A.

Interface 208A provides a number of input signals received from external system 106. Signal dm_in 606 may carry input data from external system 106 to integrated circuit 101. For example, signal dm_in 606 may be a 1-bit wide input from system 106 to circuit 103, and synchronous to a rising edge on an input clocking signal dm_clkin 605, which may be a clock signal generated within system 106. According to one embodiment of the invention, valid input clocking frequencies range from DC to 100 MHz and above. In one aspect, signal dm_clkin 605 is derived from output clocking signal dm_clkout 602 such that the state of an input buffer of debug circuit 103 during output idle periods is synchronized with input message operations. However, if software utilizing the physical interface only allows one DBUS transaction to an external system to be outstanding at once, it may be beneficial for dm_clkin signal 605 to not be related to signal dm_clkout 602 such that message transmission and reception is more efficient, because the input and output clocks are not linked. Also, hardware complexity of transmit and receive circuits of debug circuit 103 may be tailored specifically for the application, if input and output clocks are independent.

Signal RESETP is used by external system 106 to cause a POWERON reset that is a reset initiated when integrated circuit is powered on and no register state is saved. Signal RESETM 610 is used to cause a MANUAL reset whereby integrated circuit 101 is reinitialized, and one or more control registers have saved state.

It may be possible for debug circuit 103 to re-establish a connection between itself and external system 106 if link 208A is unavailable. Link 208A may be unavailable due to the link being temporarily disconnected, electrical noise, or some other reason. In particular, debug circuit 103 (or external system 106) may monitor signals of the link to determine that the link is unavailable. For example, if the link is broken, an external system 106 such as a debug tool may detect the dm_clkout 602 frequency go to a DC value, but external system 106 will not detect an operating mode of the integrated circuit 101 (such as a standby state) on signal lines for the STATUS0/STATUS1 608 signal. When the link 208A is re-established, external system 106 may resynchronize to a message boundary by monitoring a synchronization signal, such as dm_osync 604, to detect a start of message or an idle period. For example, if external system 106 detects a transition of signal dm_osync 604 with the value of dm_out==obX000, a start of an idle period has been detected, and external system 106 is now synchronized. In a similar manner, integrated circuit 101 may resynchronize using synchronization signal dm_isync 607.

Table 2 below shows signals of debug link 208A according to one embodiment of the invention:

TABLE 2

Debug Link Signals

| Signal | Lines | Source | Internal Pull-up | Description |
|---|---|---|---|---|
| dm_clkout | 1 | IC (Integrated Circuit) | No | Debug link clock from IC. Inactive when Debug Module is not enabled, during a reset sequence and in standby state. |
| dm_out[0,n] | 4 or 8 | IC | No | Output data. |
| dm_osync | 1 | IC | No | Output sync. |
| dm_clkin | 1 | External system | Yes | Clock from external system, in phase with dm_in and dm_sync. Also Debug Module enable/disable control sampled at the end of a power-on or manual reset sequence. |
| dm_in | 1 | External system | Yes | Input data. Also reset mode signal sampled at the time either RESETP or RESETM is pulsed low. |
| dm_isync | 1 | External system | Yes | Input sync. Also processor suspend mode sampled at the end of a power-on or manual reset sequence. For example, a value of 0 may indicate that processor 103 remains suspended following a reset. If the value is 1, the processor operates normally after reset. |
| STATUS0/ STATUS1 | 2 | IC | No | Processor state. |
| RESET | 1 | External system or IC | No | Board-level reset signal. This can be connected to either the RESETP pin or the RESETM pin of the IC. For certain target boards, this signal may also be asserted when a reset button on the target board is pressed, allowing the external system to monitor such occurrences. |

Integrated circuit 101 may also include a programmable circuit 309 which provides clocking information for debug link circuit 303. Programmable divider circuit 309 may accept an input clock 310 which may be an internal bus frequency of system bus 105. Programmable divider circuit 309 may access one or more registers 209 to determine the amount by which the input clock 310 will be divided. For example, register 209 may be a 16-bit value. Register 209 may also be programmable by integrated circuit 101 or an external system 106 in order to change the transmission frequency of debug circuit 103. Output logic 611 may use the clocking information as the dm_clkout signal 602 for use by external system 106 for receiving data.

Message protocols may be used over both a high-performance interface 208A, and a JTAG interface 208B in accordance with the IEEE 1149.1 standard. The message protocol involves sending bus messages and trace messages over one or more links 208. According to one embodiment of the invention, the message protocol used to communicate over JTAG interface 208B is the same protocol used over interface 208A. In one embodiment, the JTAG interface 208B is operable when selected by a circuit of the debug circuit 103, such as when a high-performance link 208A is unavailable. In another embodiment, the JTAG interface 208B is selected by writing a value to a register in the debug circuit, the value indicating that messages should be transmitted over interface 208A. By using standard JTAG components and protocols, existing JTAG components can be reused in external system 106.

Figure 7:
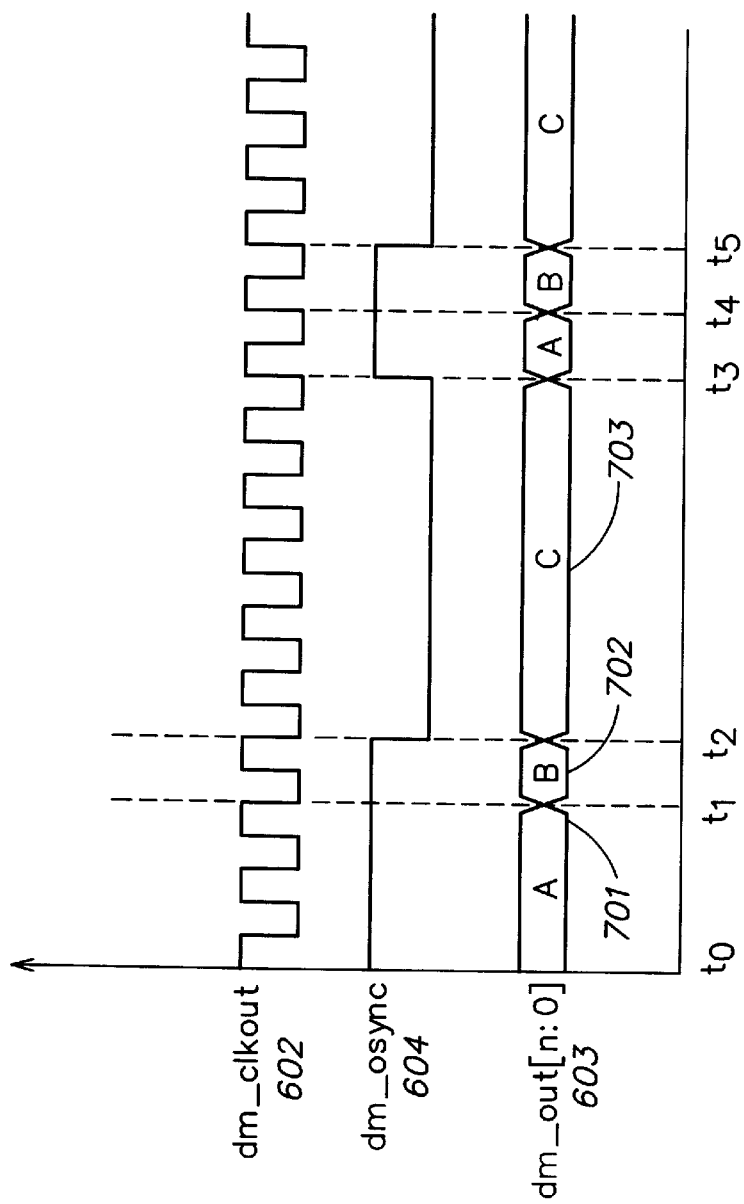
FIG. 7 is a timing diagram showing an output protocol in accordance with one embodiment of the invention.

FIG. 7 shows a timing diagram of an output message protocol in accordance with one embodiment of the present invention. Signal A 701 indicates an output-idle state wherein output-idle words are transmitted over the link 208A during times when the debug circuit has not data to send, for example, when a trace buffer is empty. When trace processor 202 produces trace messages which are stored in trace storage 205, they may be sent over link 208A with an idle word separating different trace messages.

Output-idle words may serve another purpose; they may provide an indication to an external system 106 that debug circuit 103 may be capable of receiving a DBUS request message. In particular, the output-idle word may include a bit which indicates a status of a receive buffer located in debug circuit 103. For example, the bit may indicate that the receive buffer is empty, and that a message may be transmitted from system 106. Alternatively, the bit may indicate that the receive buffer is full, and a message should not be transmitted by system 106. According to one embodiment of the invention, trace messages (DTRC) are transmitted by debug circuit 103 to external system 106 without regard to flow control information. Thus, DTRC messages can be discarded if a receive buffer of external system 106 cannot receive additional trace messages. If DBUS request messages are discarded, an associated DBUS response will not be generated, and an error will occur.

As shown in FIG. 7, signal A 701 may correspond to an output-idle state, with a value of dm_out [0,2]==0b000, and dm_out [3]==debug circuit receiver buffer busy (1) or empty (0). Signal B 702 may be a start of message indication, with dm_out [0,2] equaling the message type. Signal C 703 indicates transmission of message data such as a DBUS request or DTRC message.

Figure 8:
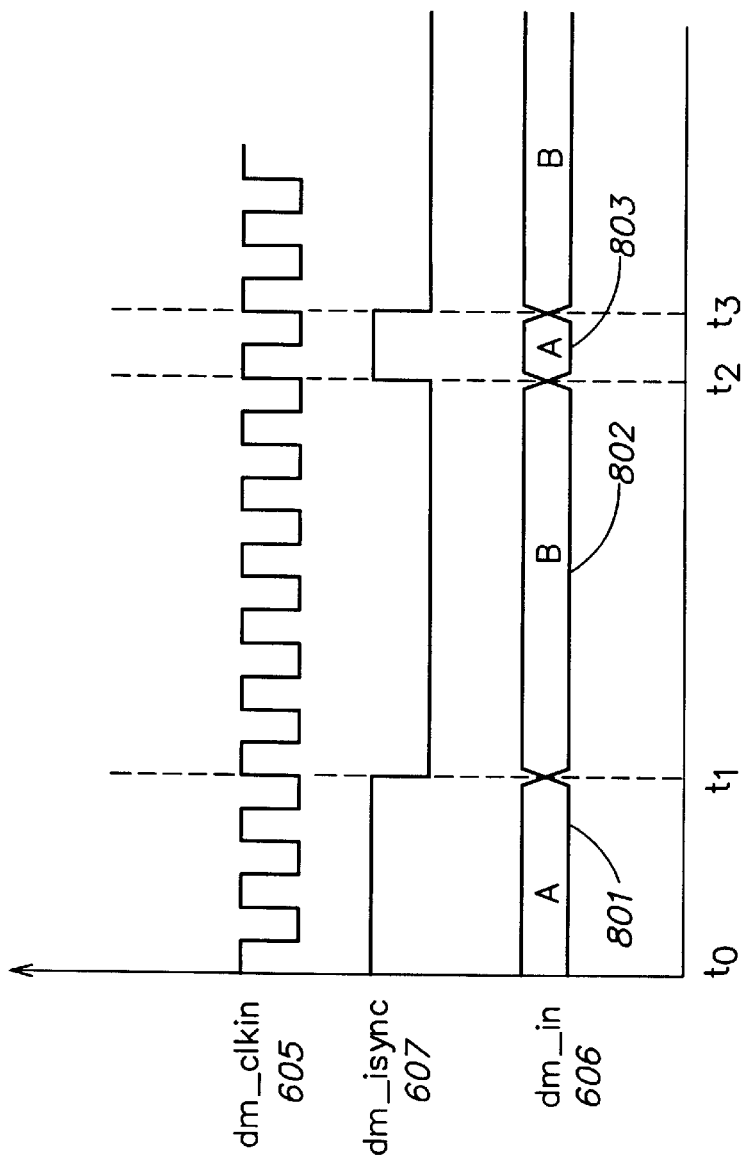
FIG. 8 is timing diagram showing an input protocol in accordance with one embodiment of the invention.

FIG. 8 shows a timing diagram associated with an input message protocol of a debug circuit 103. Signal A 801 indicates an input-idle state, whereby dm_in==0 (debug adapter DBUS receive queue ready), and a value dm_in==1 (debug adapter DBUS receive queue busy). Signal B 802 provides message data such as a DBUS response. Because trace messages are not transmitted from an external system 106 to debug circuit 103, header information is not required in message data 802.

According to one embodiment, signal dm_isync 607 is used to distinguish message data on the dm_in pin 606 from line idle. A transition from dm_isync==1 to dm_isync==0 indicates a start of a message and a transition from dm_isync==0 to dm_isync 1 indicates the end of the message. Messages may be separated by one or more clock periods of idle (dm_isync==1).

Tables 3 and 4 below, show examples of a DTRC message and a DBUS messages, respectively, transmitted over debug link 208A:

TABLE 3

Trace Message (DTRC) Example

| Clock Cycle | dm_osync state | dm_out[0,3] contents |
|---|---|---|
| −1 | 1 | Output-Idle<br>[0,2] = 0b000 (MHDR_IDLE)<br>[3] buffer status |
| 0 | 1 | Header [0,3]<br>[0,2] == 0b010/0b011 (MHDR_DTRC_{BACK/TRIG})<br>[3] == bit 3 of trace header |
| 1 | 0 | Header [4, 7] |
| 2 | 0 | Header[8, 11] |
| 3 | 0 | Header [12, 15] |
| 4 | 0 | Program Counter (PC) Value [0, 3] |
| 5 | 0 | PC Value [4, 7] |
| 6 | 0 | PC Value [8, 11] |
| 7 | 0 | PC Value [12, 15] |
| 8 | 0 | PC Value [16, 19] |
| 9 | 0 | PC Value [20, 23] |
| 10 | 0 | PC Value [24, 27] |
| 11 | 0 | PC Value [28, 31] |
| 12 | 1 | Output-Idle<br>[0,2] = 0b000 (MHDR_IDLE)<br>[3] = buffer status |

TABLE 4

DBUS Read Request Message Example

| Clock Cycle | dm_osync state | dm_out[0, 3] contents |
|---|---|---|
| −1 | 1 | Output-Idle<br>[0,2] == 0b000 (MHDR_IDLE),<br>[3] == buffer status |
| 0 | 1 | Header [0,3]<br>[0,2] == 0b001 (MHDR_DBUS)<br>[3] = no useful data |
| 1 | 0 | Dummy nibble (no useful data) |
| 2 | 0 | Opcode [0,3] |
| 3 | 0 | Opcode [4,7] |
| 4 | 0 | Address [0,3] |
| 5 | 0 | Address [4,7] |
| 6 | 0 | Address [8,11] |
| 7 | 0 | Address [12,15] |
| 8 | 0 | Address [16,19] |
| 9 | 0 | Address [20,23] |
| 10 | 0 | Address [24,27] |
| 11 | 0 | Address [28,31] |
| 12 | 0 | Source [0,3] |
| 13 | 0 | Source [4,7] |
| 14 | 0 | TID [0,3] |
| 15 | 0 | TID [4,7] |
| 16 | 0 | Mask [0,3] |
| 17 | 0 | Mask [4,7] |
| 18 | 1 | Output-idle<br>[0,2] = 0b000 (MHDR_IDLE)<br>[3] = buffer status |

Figure 9:
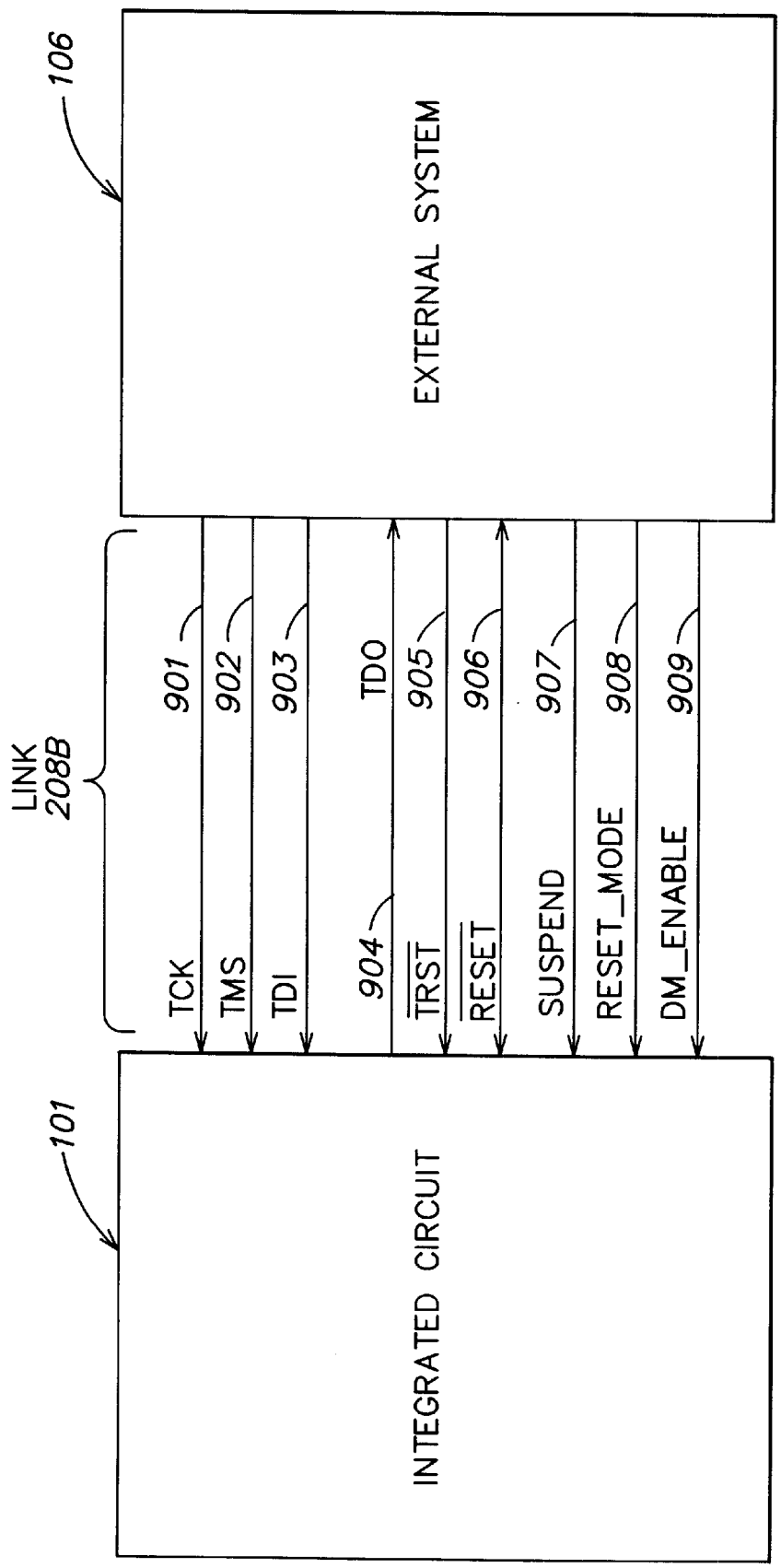
FIG. 9 shows one embodiment of a JTAG interface in accordance with one embodiment of the invention.

FIG. 9 shows a JTAG interface 208B that connects an external system 106 to an integrated circuit 101. Link 208B includes a number of signals, and according to one embodiment, these signals are in accordance with the IEEE standard and one or more signals associated with power management. Signal TCK 901 provided from external system 106 is an external clock signal used for clocking data received from system 106. Signal TCK is a test clock which controls the timing of JTAG interface 208B, and is generally independent of system clocks. Signal TMS indicates a test mode select which controls the operation of a JTAG state machine (discussed below). Signal TDI 903 is serial data received from external system 106 and is generally synchronous with signal TCK 901. Signal TDO 904 is data transmitted from integrated circuit 101. Signal TDO generally carries data to a boundary scan or instruction register discussed below with reference to FIG. 10. Signal TDO is typically synchronous with signal TCK 901. Signal $\overline{TRST}$ 905 received from system 106 is a reset signal. In one embodiment, integrated circuit 101 includes a JTAG processor 207 which further includes a TAP controller, the TAP controller operating according to a finite state machine. Operation of the TAP controller and finite state machine will be discussed further below with reference to FIGS. 10 and 11. The TAP controller finite state machine is reset by the $\overline{TRST}$ signal 905 going low. Signal $\overline{TRST}$ 905 is used to initialize the JTAG interface 208B when the signal 905 is deasserted. Signal $\overline{TRST}$ is generally asynchronous to signal TCK 901.

Additional signals may be included, such as a $\overline{RESET}$ signal that is a bi-directional signal whereby external system 106 may monitor the signal to detect when board-level reset is initiated. SUSPEND signal 907 determines a processor mode following a reset. A suspending of a processor may include stopping the processor from executing instructions. A processor may be stalled, for example, by stalling an instruction fetch unit or circuit of the processor, preventing the processor from fetching new instructions to be executed. For example, a processor may remain suspended following a reset, or may operate normally. System 106 also provides a RESET_MODE signal 908 that may force a debug reset POWERON reset or MANUAL reset. Signal dm_enable 909 is transmitted by system 106 to determine the debug module state following a reset. For example, the debug circuit 103 may be enabled following reset, or disabled with its clock source turned off following reset.

Table 5 below shows signals of a JTAG link in accordance with one embodiment of the invention:

TABLE 5

JTAG Debug Link Signals

| Signal | Source | Description |
|---|---|---|
| TCK | From External system | JTAG clock |
| TDI | From External system | JTAG data in |
| TDO | From IC | JTAG data out |
| TMS | From External system | JTAG test mode select |
| $\overline{TRST}$ | From External system | JTAG interface reset. The TAP controller finite state machine is reset by TRST going low. This pin may have no effect on other chip functions. |
| $\overline{RESET}$ | Bi-directional | External system can monitor this signal to detect when board-level reset is initiated. |
| SUSPEND | From External system | Processor suspend mode following reset.<br>Value - Description |

TABLE 5-continued

JTAG Debug Link Signals

| Signal | Source | Description |
| --- | --- | --- |
| | | 0 - Processor remains suspended following reset |
| | | 1 - Processor operates normally following reset |
| RESET_MODE | From External system | This signal is sampled at the time either $\overline{\text{RESETP}}$ or $\overline{\text{RESETM}}$ is pulsed low and allows the tool to determine the type of reset function performed. |
| | | Value - Description |
| | | 0 - Forces a DEBUG reset regardless of whether the $\overline{\text{RESETP}}$ pin or the $\overline{\text{RESETM}}$ pin is asserted. |
| | | 1 - A normal POWERON reset or MANUAL reset is initiated when the corresponding reset pin is asserted. |
| DM_ENABLE | From External system | Debug Module state following reset. |
| | | Value - Description |
| | | 0 - The Debug Module is enabled following reset. |
| | | 1 - The Debug Module is disabled with its clock source turned off following reset. |

A JTAG link 208B may be used alternatively to link 208A to connect to a debug tool, however, the effective bandwidth (messages per second) is typically much lower than that of link 208A. Messages capable of being sent over link 208A may also be sent via JTAG link 208B. In one embodiment, a JTAG link 208B has the following characteristics:

- Standard JTAG functionality is not compromised (e.g. the standard JTAG instruction "space" is unchanged) and the JTAG port may also be used for conventional boundary scan testing.
- JTAG port 208B may be accessed from standard JTAG state-machine interface devices.
- The JTAG port allows "unsolicited" messages to be sent from integrated circuit 101 to the debug tool. Conventional use of JTAG ports only allow request/response type messages from an external system 106.
- JTAG link 208B uses an identical message structure as link 208A.
- The JTAG TAP controller implements all the mandatory features of a standard JTAG port, including the well-known mandatory JTAG instruction "BYPASS" and the optional instruction "IDCODE". In one embodiment, a JTAG instruction register defaults to the "IDCODE" instruction.

The JTAG link may be used, for example, as a conventional boundary scan port, or an interface for transferring debug information. Access to debug features may be enabled, for example, by loading a command to a JTAG instruction register. At a POWERON state of integrated circuit 101, the debug circuit may default to select link 208A as the debug interface, and enable JTAG interface 208B for normal boundary scan operations. Debug circuit 103 may change its selection to JTAG interface 208B when it detects that a command has been written into the JTAG instruction register.

As discussed above, input and output debug messages transferred via JTAG port 208B may be identical to those which can be sent via link 208A. As discussed above, the messages sent between integrated circuit 101 and external system 106 may be variable length messages. For example, a longest message may be 41-bytes (a DBUS 32-bit storage message request from integrated circuit 101) and a shortest message of 3-bytes (an instruction address or instruction value trace message). A JTAG debug message protocol defined herein provides a method for the integrated circuit 101 and external system 106 to determine a start and end of these variable-length messages.

Figure 10:
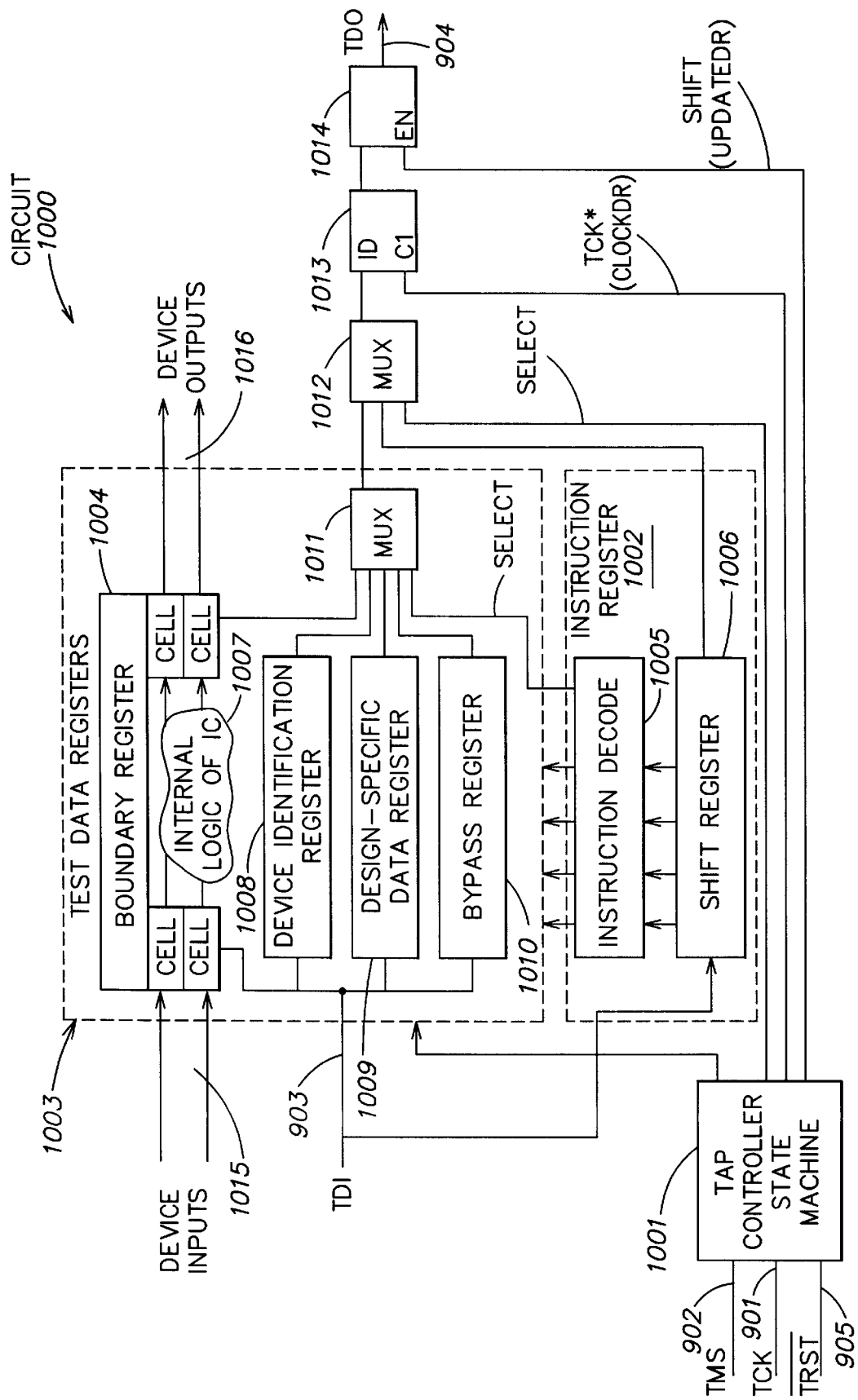
FIG. 10 is a block diagram of a standard JTAG processor.

FIG. 10 shows an example of a JTAG processor 207 in accordance with one embodiment of the invention. Boundary scan in accordance with one embodiment of the invention allows either a boundary scan or debug operations to be performed to an integrated circuit 101. Specifically, boundary scan is the application of scan data at the boundary of an integrated circuit such that internal behavior of the integrated circuit may be observed. Generally, boundary scan cells are interconnected to form a scan path between the IC's test data input (TDI) pin and test data output (TDO) pin. During normal IC operations, input and output signals pass freely through each cell, from the normal device inputs 1015 to the normal device outputs 1016. However, when the boundary-test mode is entered, the IC's boundary is controlled such that scan data is applied to inputs and scan data results are collected from outputs. Specifically, the IC's boundary is controlled such that a test stimulus can be shifted in and applied from each cell output and the test response can be captured at each cell input and shifted out for inspection.

FIG. 10 shows the IEEE standard 1149.1 architecture for a boundary scan circuit 1000. The architecture includes an instruction register 1002, a bypass register 1010, optional user data registers 1009 specific to the integrated circuit to be tested, and a test interface referred to as the test access port or TAP. In FIG. 10, the boundary scan register 1004 is a serially accessed data register made up of a series of boundary scan cells shown at the input and output boundary of internal logic of the integrated circuit 1007.

The instruction register 1002 and test data registers 1003 are separate scan paths arranged between the primary test data input (TDI) pin of JTAG interface 208B and primary test data output (TDO) pin of interface 208B. This architecture allows the TAP controller state machine 1001 to select and shift data through one of the two types of scan paths, instruction or data, without accessing the other scan path.

According to IEEE standard 1149.1, there are a number of required and optional registers. Instruction register 1002 is a required register which is responsible for providing address and control signals to access a particular data register in the scan path. Instruction register 1002 is accessed when the TAP controller state machine 1001 receives an instruction register scan protocol. During an instruction register scan operation, the select output from state machine 1001 selects the output of the instruction register to drive the TDO pin 904.

The instruction register 1002 includes a shift register 1006 and an instruction decode circuit 1005, which may be an instruction shadow latch. The instruction shift register 1006 includes a series of shift register bits arranged to form a single scan path between the TDI 903 pins and TDO 904 pins of the integrated circuit. During instruction register scan operations, the TAP controller 1001 exerts control via an instruction register shift enable signal (SHIFTIR 1203) and an instruction register clock (CLOCKIR 1202) signals to cause the instruction shift register 1006 to preload status information and shift data from TDI to TDO. Both the preload and shift operations occur on the rising edge of TCK signal 901; however, the data shifted out from the integrated circuit from TDO 904 occurs on the falling edge of signal TCK 901.

Instruction decode circuit 1005 may include a series of latches, one latch for each instruction shift register bit. During an instruction register scan operation, the latches remain in their present state. At the end of the instruction register scan operation, the instruction register update (UPDATEIR) input updates the latches with a new instruction installed in the shift register 1006. When activated, the $\overline{\text{TRST}}$ signal 905 sets the instruction decode circuit 1005 to the value of the BYPASS instruction (or IDCODE instruction, if supported). This forces the device into its normal functional mode and selects the bypass register 1010 (or device identification register 1008, if one is present).

IEEE standard 1149.1 requires two data registers; a boundary-scan register 1004 and bypass register 1010, with a third optional, device identification register 1008. Additional design-specific data registers 1009 may also be included. The data registers 1003 are arranged in parallel from the primary TDI input to the primary TDO output. The instruction register 1002 supplies the address that allows one of the data registers to be accessed during a data register scan operation. During a data register scan operation, the addressed scan register receives a TAP control via the data register shift enable (SHIFTDR 1203) and data register clock (CLOCKDR 1202) inputs to preload test response and shift data from TDI to TDO. During a data register scan operation, the select output from state machine 1001 selects the output of the data register to drive the TDO pin 904. When one scan path in the data register is being accessed, all other scan paths remain in the present state.

The boundary-scan register 1004 includes a series of boundary-scan cells arranged to form a scan path around the boundary of the internal logic of the integrated circuit 1007. The boundary scan cells are described further with particularity in IEEE standard 1149.1-1990. At the end of a data register scan operation, the data register update (UPDATEDR) input updates the instruction decode latches with a new boundary test pattern to be applied from the device outputs 1016 of the cells.

Bypass register 1010 includes a single scan register bit. When selected, the bypass register 1010 provides a single-bit scan path between TDI and TDO. Thus, the bypass register allows abbreviating the scan path through devices that are not involved in the test. The bypass register is selected when the instruction register 1002 is loaded with a pattern of all ones to satisfy the IEEE standard 1149.1 BYPASS instruction requirement.

Device identification register 1008 is an optional register, defined by IEEE standard 1149.1, to identify the device's manufacturer, part number, revision, and other device-specific information. The device identification register may include a number of bit assignments defined for the device identification register which can be scanned out of the register 1008 after it has been selected. Although the device identification register is optional, IEEE standard 1149.1 has dedicated an instruction to select this register. The device identification register is selected when the instruction register 1002 is loaded with the ID code instruction, the bit code of which is defined by the vendor.

IEEE standard 1149.1 defines nine test instructions, of which three are required and six are optional. Below, each required instruction is discussed briefly.

The BYPASS instruction is a required instruction which allows the integrated circuit 101 to remain in a functional mode and selects that bypass register 1010 to be connected between TDI and TDO. The bypass instruction allows serial data to be transferred through the integrated circuit 101 from TDI to TDO without affecting the operation of the integrated circuit 101. The bit code of this instruction is defined as all ones by IEEE standard 1149.1-1990.

The SAMPLE/PRELOAD instruction is a required instruction which allows the integrated circuit 101 to remain in its functional mode and selects the boundary-scan register to be connected between TDI and TDO. During this instruction, the boundary-scan register can be accessed via a data scan operation, to take a sample of the functional data entering and leaving the integrated circuit 101. This instruction is also used to preload test data into the data boundary-scan register 1004 before loading an EXTEST instruction. The bit code for this instruction is defined by the vendor.

The required EXTEST instruction places the integrated circuit 101 into an external boundary-test mode and selects the boundary-scan register 1004 to be connected between TDI and TDO. During this instruction, the boundary-scan register 1004 is accessed to drive test data off-chip via boundary outputs and receive test data off-chip via boundary inputs. The bit code of this instruction is defined as all zeros by IEEE standard 1149.1. Further, one or more of the optional instructions as defined by IEEE standard 1149.1 may be used.

Operation and use of JTAG interface 208B according to the IEEE standard may be found in IEEE standard 1149.1-1990 (including IEEE standard 1149.1A-1993), supplement to IEEE standard 1149.1-1990, IEEE standard test access port and boundary-scan architecture, IEEE standard 1149.1b-1994, all of which are incorporated by reference herein in their entirety. Also, for further understanding of JTAG port operation, please refer to the book entitled "The Boundary-Scan Handbook," by Kenneth P. Parker, Kluwer Academic Publishers, Norwell, Massachusetts, 1992, herein incorporated by reference in its entirety.

Figure 11:
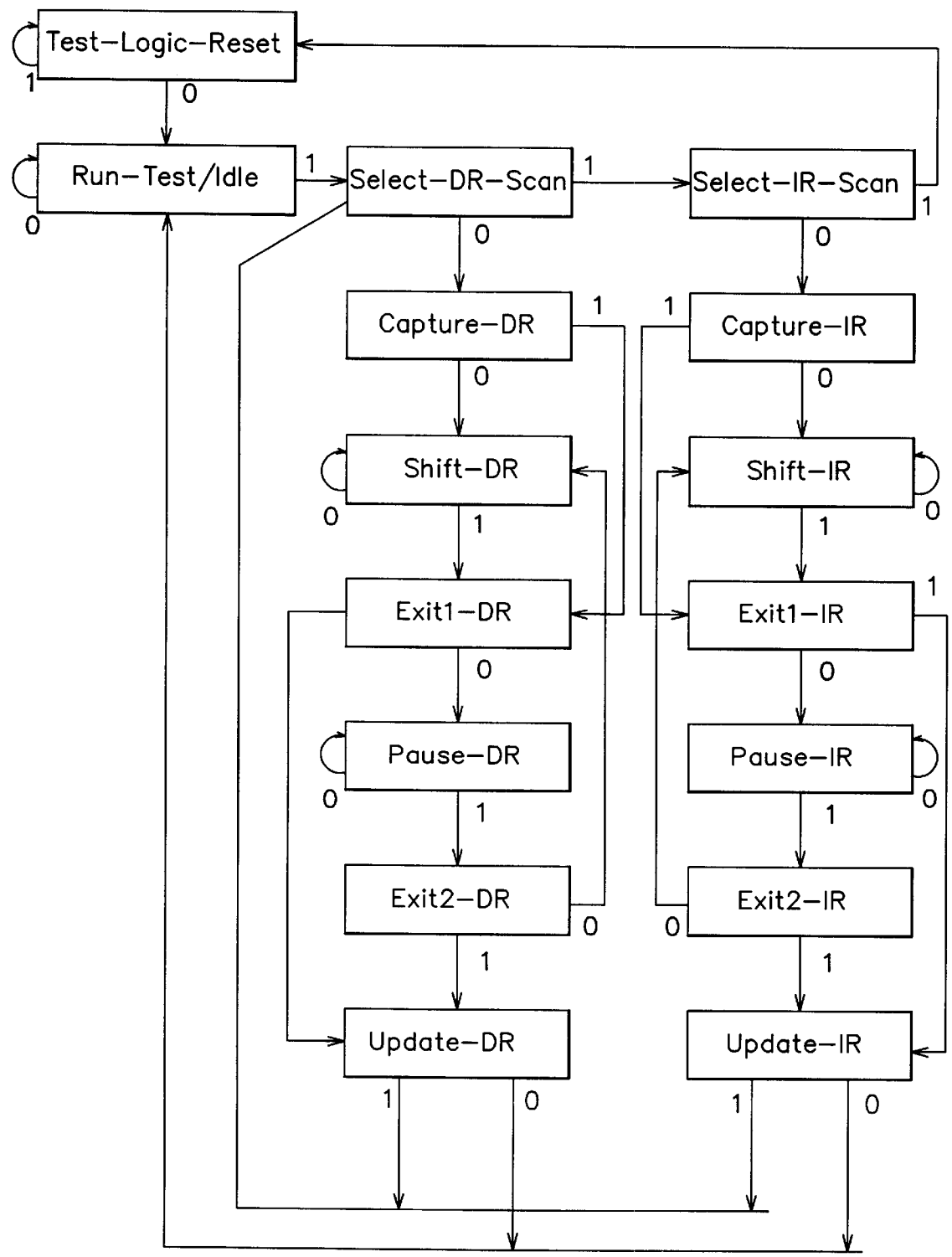
FIG. 11 is a state diagram showing operation of a standard JTAG Test Access Port (TAP) controller.

FIG. 11 shows a standard TAP controller state diagram in accordance with IEEE standard 1149.1-1990. The TAP controller finite state machine 1001 shown in FIG. 10 is controlled by the test clock (TCK) and test mode select (TMS) inputs. These two inputs determine whether an instruction register scan or data register scan is performed. The TAP controller includes a small controller design, driven by the TCK input which corresponds to the TMS input as shown in the state diagram in FIG. 11. The IEEE standard 1149.1 test bus uses both clock edges of TCK. TMS and TDI are sampled on the rising edge of TCK, while TDO changes on the falling edge of TCK. It is noted that in FIG. 11, the values shown adjacent to each state transition represents the signal present at TMS at the rising edge of TCK.

The main state diagram shown in FIG. 11 includes six steady states: Test-Logic-Reset, Run-Test/Idle, Shift-DR, Pause-DR, Shift-IR, and Pause-IR. At POWERUP, or during normal operation of integrated circuit 101, the TAP controller 1001 is forced into the Test-Logic-Reset state by driving the TMS signal high and applying five or more TCKs. In this state, the TAP controller issues a reset signal that places all test logic in a condition that does not impede normal operation of the host IC. When test access is required, a protocol is applied via the TMS and TCK inputs, causing the tap to exit the Test-Logic-Reset state and move through the appropriate states. From the Run-Test/Idle state, an instruction register scan or a data register scan can be issued to transition the TAP controller 1001 through the appropriate states as shown in FIG. 11.

The first action that occurs when either block is entered is a Capture operation. The Capture-DR state is used to Capture (or parallel load) the data into the selected serial data path. In the instruction register, the Capture-IR state is used to capture status information into the instruction register.

From the Capture state, the TAP controller transitions to either the Shift or the Exit-1 state. Normally, the Shift state follows the Capture state so that test data or test information can be shifted out for inspection and new data shifted in. Following the Shift state, the TAP controller 1001 either returns to the Run-Test/Idle state via Exit-1 and Update states or enters the Pause state via Exit-1. From the Pause state, shifting can resume by re-entering the Shift state via the Exit-2 state or being terminated by entering the Run-Test/Idle state via the Exit-2 and Update states. Thus, a JTAG debug register 1201 may be used that shifts data in through TDI and out through TDO as shown in FIG. 11.

Figure 12:
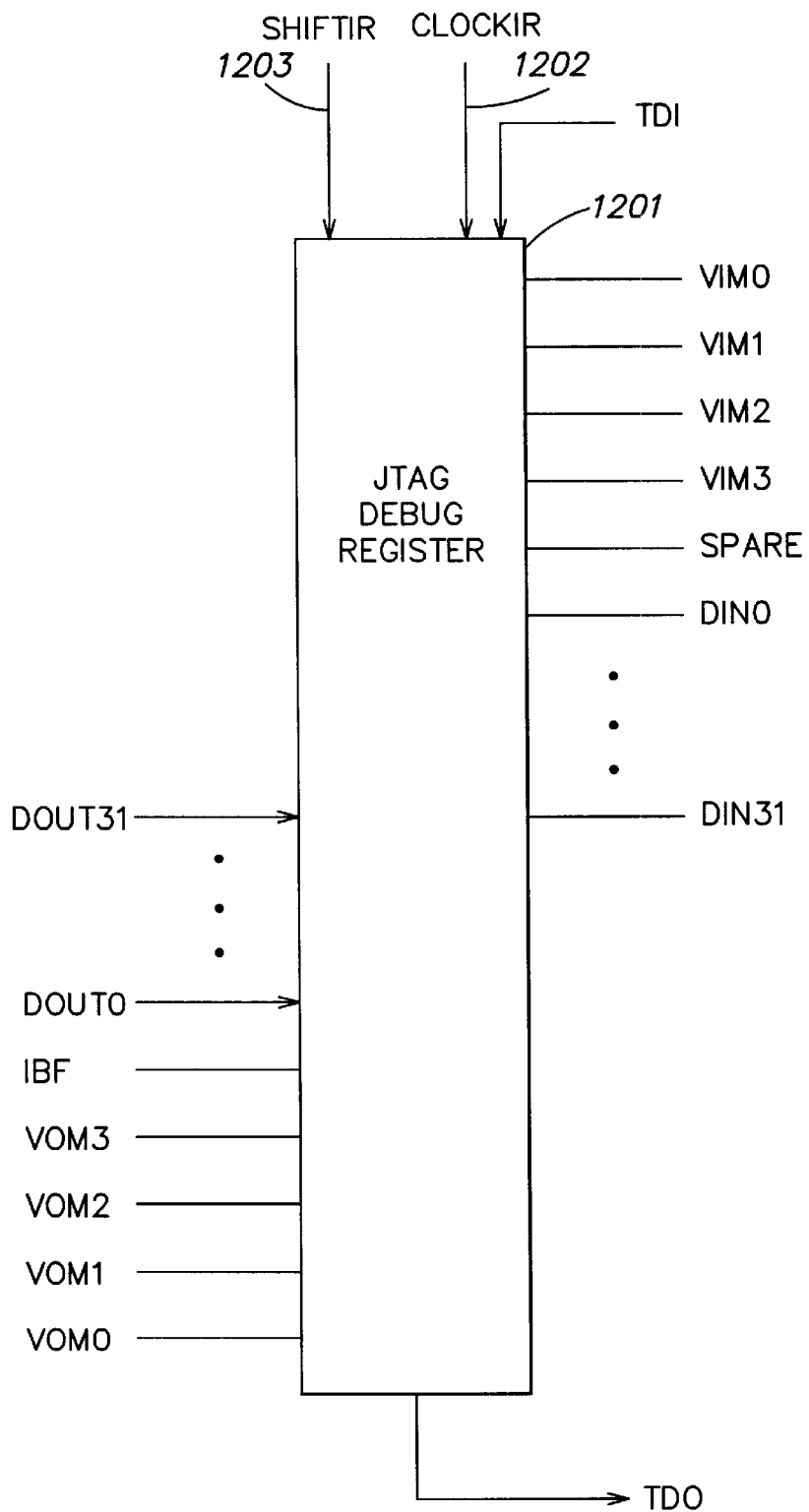
FIG. 12 is a block diagram of a JTAG debug register in accordance with one embodiment of the invention.

In one embodiment, there are two parts to the JTAG debug message protocol. At the lowest level, data and status bits are transferred between the external system and a serial data shift register 1006 located in debug circuit 103. At a higher level, the protocol provides a mechanism for detecting start and end messages including a variable number of bytes. As shown in FIG. 12, a data register 1009 such as JTAG debug data register 1201 may be provided which is 74 bits long, the debug data register including four valid input message (VIM) status bits VIM 3, VIM 2, VIM 1, and VIM 0, one associated with each of four data byte positions, 32 data input bits, 32 data output bits, and input buffer full (IBF) status bit, and 4 valid output message (VOM) status bits VOM 3, VOM 2, VOM 1, VOM 0, one associated with each of four data byte positions. Table 6 below shows one embodiment of status bits in accordance with one embodiment of the invention.

TABLE 6

Status Bit Information

| Status Bit | Description |
| --- | --- |
| VIMx | 0 – input byte position has no valid data<br>1 = the serial word which has just been shifted in contains one byte of an input message in the corresponding byte position |
| VOMx | 0 = output byte position has no valid data<br>1 = the serial word which has just been shifted out contains one byte of an output message in the corresponding byte position |
| IBF | 0 = the input message buffer in the JTAG TAP controller 207 is available for a new message.<br>1 = the input message buffer in the JTAG TAP controller 207 is full. |

The following transfers may take place between JTAG debug register 1201 and external system 106:

(1) The external system 106 can poll only the output status from JTAG debug register 1201 (5 bits of the debug register 1201 are shifted).

(2) External system 106 can poll the output status plus data from 1-byte to 4-bytes of an additional message from the JTAG debug register 1201 (13, 21, 29, or 37-bits of JTAG debug register 1201 are shifted).

(3) External system 106 can send status information and from 1-byte to 4-bytes of an input message to JTAG debug register 1201 (13, 21, 29, or 37-bits of JTAG debug register 1201 are shifted).

(4) External system 106 can poll status information and from 1-byte to 4-bytes of an output message from the JTAG debug register and simultaneously send status and from 1-byte to 4-bytes of an input message to the JTAG debug register 1201 (13, 21, 29, or 37-bits of the JTAG debug register 1301 are shifted).

Figures 13A, 13B:
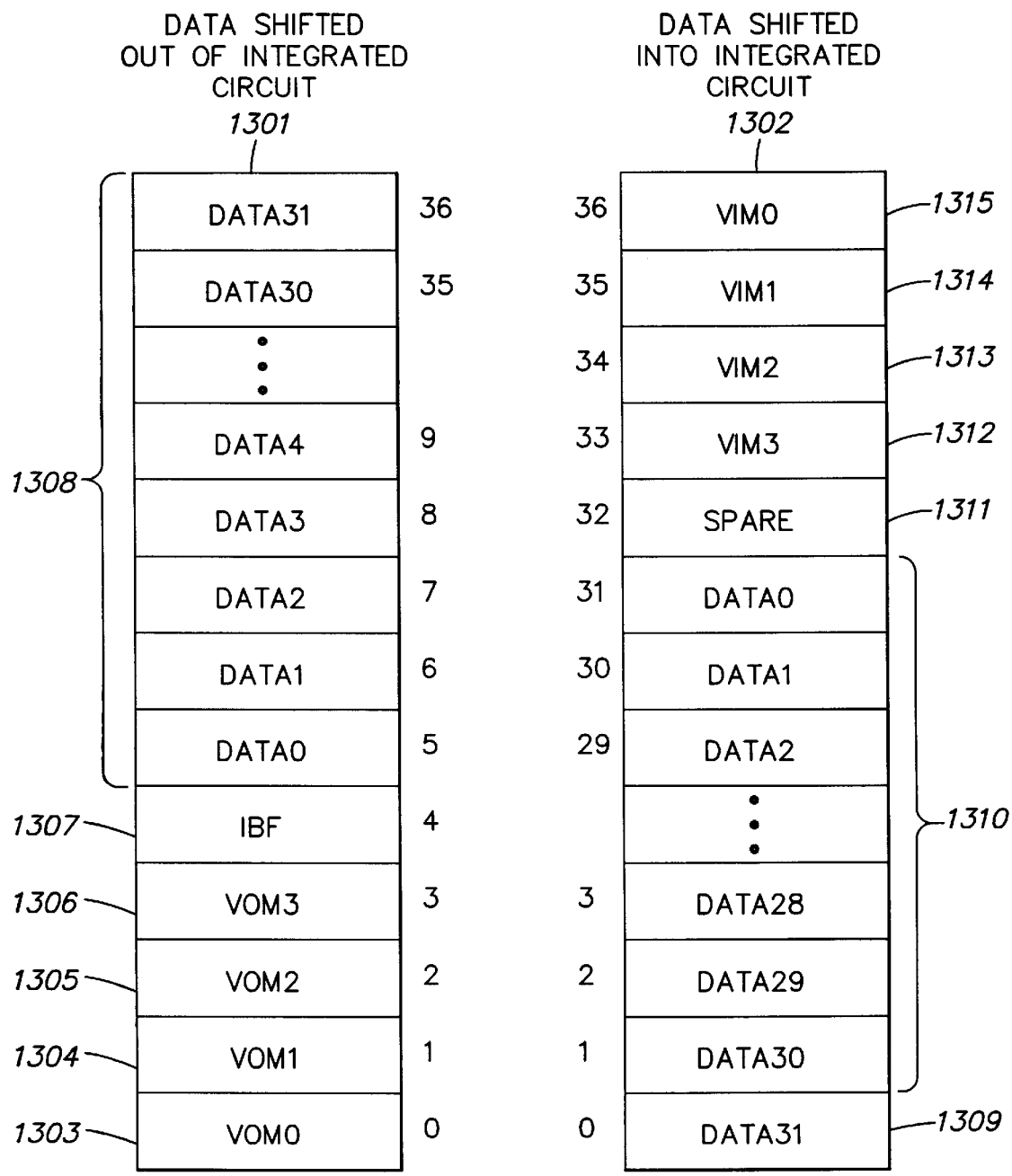
FIGS. 13A and 13B show a data shift of data transmitted and received, respectively, by the JTAG debug register shown in FIG. 12.

As shown in FIG. 13, when integrated circuit 101 is connected to an external system 106 capable of shifting variable length data words, external system 106 transfers 13, 21, 29, or 37-bits into the JTAG debug register 1201 giving 8, 16, 24, or 32 message data bits and status bits to indicate valid input data in each of the 4-byte positions (plus one unused bit). When polling out an output message, external system 106 shifts 13, 21, 29, or 37-bits out of the JTAG debug register 1201 with four of these bits indicating valid output data in another status bit indicating the state of the JTAG TAP controller debug message input buffer (IBF).

To detect when integrated circuit has a pending output message and to determine when the input buffer is available for a new input message, external system 106 polls the JTAG interface 208B at regular intervals to shift out the IBF and VOMx status bits. In one embodiment of the invention, the VOMx status bits are located closest to the TDO end of the shift register 1201. The external system 106 can therefore poll out the VOMx and IBF status by shifting just 5-bits out of the shift register following the capture DR state. At the same time as these five status bits are being shifted out of the shift register, the VIM status bits may be shifted into the input end of the shift register from the TDI pin and is latched during the update-DR state. This simultaneous shifting is advantageous, since both input and output status may be determined within n clock cycles to read n status bits on both the input and output paths. For example, when using five status bits, five clock cycles are needed. When the external system 106 has no pending input message to send, and it simply wants to poll the IBF and VOMx status bits, system 106 sets all VIMx bits to "0" during the five shift cycles.

After the five status bits have been shifted out, external system 106 can determine that an output message exists and then continues shifting a further 8, 16, 24, or 32 times depending on which VOMx bits equals "1". The external system 106 now has assembled the first bytes of an output message. External system 106 continues this process of shifting out just the IBF and VOMx bits, testing the VOMx bits and then shifting data bits depending on which VOMx bits equals "1". The detection of any VOM bit equals "0" indicates the end of the message. Once the end of the message has been reached, external system 106 does not need to shift additional data bits out of shift register 1201.

Input messages longer than 4-bytes are sent as one or more 4-byte segments followed by a segment containing fewer bytes. For each 4-byte segment of the message, the external system 106 shifts 37 bits into TDI with the VIMx status bits in the last positions (the positions closest to TDI). For the last segment of a message containing fewer than 4-bytes, external system 106 shifts 13, 21, or 29-bits into TDI with appropriate VIMx bits indicating the number of valid bites. During message transfers, the first VIMx bit equals "0" indicates the end of the input message. When the length of an input message is a multiple of 4-bytes, the end of the message is indicated by a 1-byte segment (13 bits) with all VIMx bits equal to "0".

The JTAG TAP controller 207 may include an input message buffer large enough to hold the largest input message plus an output message buffer large enough to hold the largest output message. The DBUS messaging protocol discussed above may allow one outstanding response in each transmission direction, so it is possible for external system 106 to send a response message immediately following a new request. Flow control, therefore, may be used to eliminate the possibility of ever having a message in the input buffer overwritten before it has been moved into the debug circuit 103. Flow control may be performed by sending an input status buffer bit in the JTAG debug register 1201, the input buffer status bit being adjacent to the VOM 3 bit. The external system 106 can poll out just 5-bits, one of which determines whether the input buffer can accept a new message and the other four determining whether there is an output message pending.

As discussed above with respect to FIG. 3, debug circuit 103 may divide down the system bus clock frequency using a programmable divider circuit 309 to provide the dm_clkout clock source for link 208A. For example, divider 309 may use a value of 0xFFFF, providing a link clock frequency of approximately 1.5 KHz with a bus clock speed of 200 MHz. That is, the clock frequency 200 MHz may be divided by (0xFFFF*2), providing a link clock frequency of 1525.90 Hz. The divider 309 may store a value of a field in a memory-mapped register which can be changed by host debug software executing on external system 106. This memory-mapped register may be accessed, for example, by initiating a DBUS write command from external system 106 or any other to write a value into the register. In some applications, the processor and bus clock frequencies can by dynamically changed by power-management software of the integrated circuit 101.

By deriving link 208A clock from a bus clock, link 208 clock speed automatically follows changes in bus clock speed allowing link 208A communication to be maintained over any system bus speed range. When processor 101 enters a stand-by state, a phased-locked-loop (PLL) and a master oscillator associated with the transmit circuit may be disabled whereby an output clock signal of the integrated circuit 101 such as dm_clkout 602 assumes a steady DC level. External system 106 may monitor the STATUS0/STATUS1 signals 608 to determine when processor 102 has entered a standby state.

As discussed, external system 106 may monitor a state of integrated circuit 101, such as power management states wherein one or more modules of integrated circuit are halted, enabling power consumption to be reduced. Power management functions may be performed by a power management circuit or unit of integrated circuit 101 as is known in the art. These states may include a sleep, standby, module standby and other states. For example, a normal operation state indicates that processor 102 of circuit 101 is currently operating normally, i.e. reading and executing instructions, performing system bus functions, etc. A standby state indicates that the system clock of processor 102 is not running, and the processor 102 is not currently executing instructions or is halted, and other on-chip supporting modules may also be halted. When integrated circuit 101 is in a sleep state, a clock controller is operating, processor 102 is halted, and one or more on-chip supporting modules are operating. When circuit 101 is in a module standby state, the processor 102 is operating, but one or more modules are in a halted state.

In particular, external system 106 may monitor the STATUS0/STATUS1 signals to determine the operating status of integrated circuit 101. For example, a value of "HH" (H=high signal level) on STATUS0/STATUS1 signal pins 608 may indicate a RESET mode wherein processor 102 has been reset. A value of "HL" (L=low signal level) on STATUS0/STATUS1 signal pins 608 may indicate a sleep state. A value of "LH" on STATUS0/STATUS1 signal pins 608 may indicate a standby state, and a value of "LL" may indicate a normal operating state.

An interesting situation occurs if the integrated circuit 101 is in a module standby state wherein one or more of the supporting modules are powered down, but the processor is operating. If external system 106 attempts to perform a bus transaction such as by sending a DBUS request message to a module is powered down, an arbiter associated with system bus 105 provides an error response to external system 106. In one aspect of the invention, the arbiter is aware of the states of each module associated with bus 105 and monitors bus transactions between the modules. If the arbiter detects a DBUS request to a powered-down module, the arbiter generates a DBUS response indicating an error, which will be transferred to the external system 106.

The DBUS response may not indicate the cause of the error. In this case, external system 106 may, in response to receiving the DBUS error response, read a memory-mapped register in integrated circuit 101 that indicates the powered-down module's state. If the register indicates an error, external system 106 determines that the error is not due to a power-management power-down of the module. If the register indicates no error, the external system 106 determines that the module is powered down. External system 106 may also access registers of the power management unit to verify the state of the module, and may power-up the module if required.

External system 106 such as debug software tool may issue a command to "wake-up" processor 101 from a standby state to place it in a normal operating state. However, it is realized that once a wake-up command has been issued, it can take a period of time for a transmission PLL to stabilize and for internal clocks of circuit 101 to be enabled. The debug software tool may be adapted to monitor the STATUS0 and STATUS1 signals and delay any DBUS request messages until integrated circuit 101 is operating in a sleep state wherein normal clock pulses resume on signal dm_clkout 602.

When processor 102 is in a standby state, there are no clock pulses occurring on dm_clkout 602. However, external system 106 can generate clock pulses on dm_clkin 605 using an external clock 106. This allows external system 106 to send a "wake-up" message to, processor 102. The message may be, for example, a single byte message. This byte is assembled in an input buffer of debug circuit 103 by a state machine using dm_clkin signal 605. This state machine detects that a byte has been received by external system 106, that the processor 102 is in standby state, and so the state machine asserts a wake-up signal to a power management unit of processor 102 (not shown).

Figure 14:
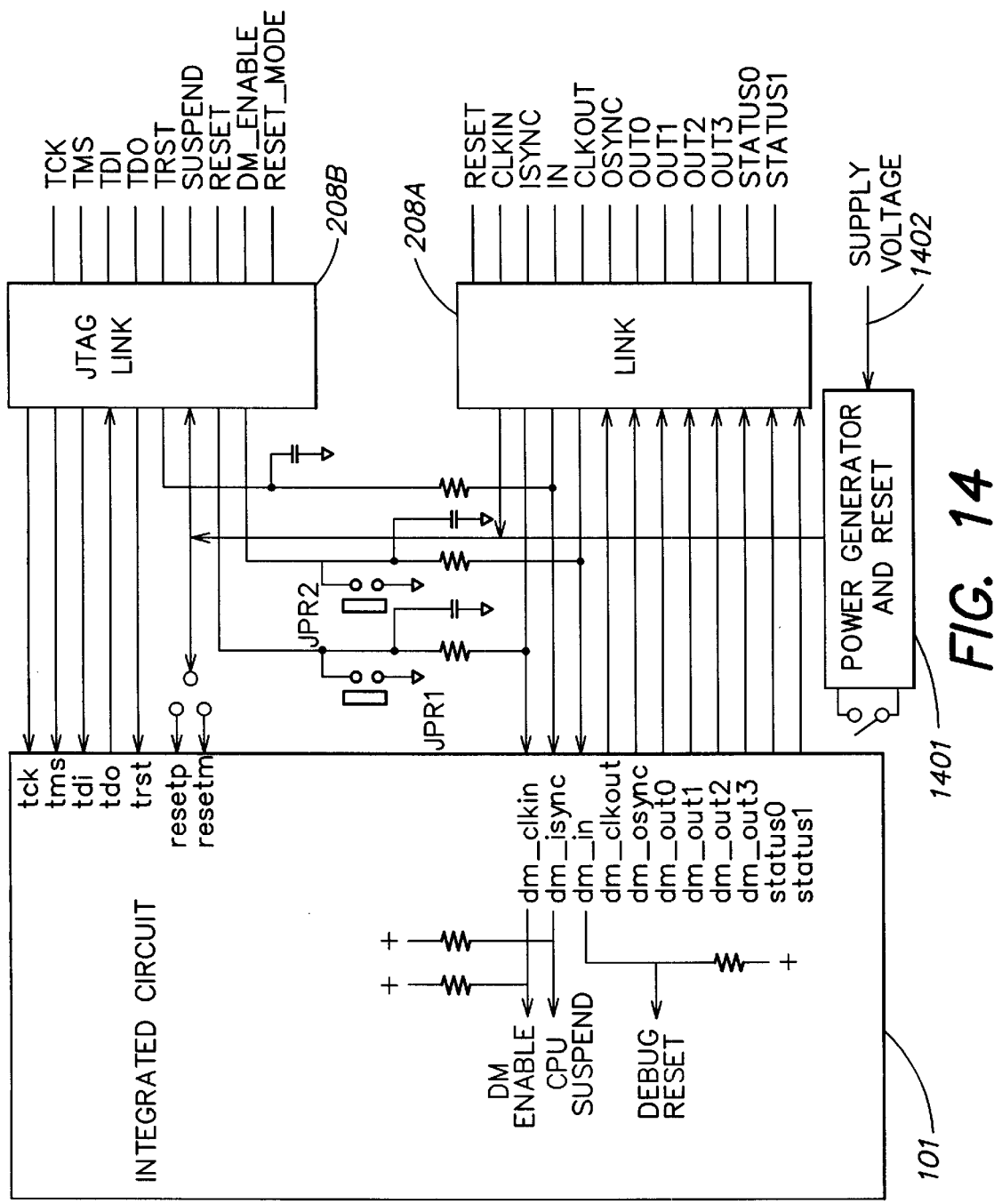
FIG. 14 is a circuit block diagram showing two interfaces of an integrated circuit.

As discussed, external system 106 may monitor integrated circuit 101 during a reset sequence. In particular, three pins may be sampled from either interfaces 208A or 208B during a reset sequence which allow the following to be performed as shown in FIG. 14:

Debug circuit to be enabled or disabled.
  The signal used to enable or disable the debug module is referred to as DM_ENABLE. When using link 208A, for example, the signal is obtained by sampling the dm_clkin 606 signal during reset.

Processor to be brought up in a suspended or running state. The signal used to accomplish this is referred to as the SUSPEND signal. When using link 208A, the signal is obtained by sampling the dm_isync 607 pin during a reset.

Reset to be forced by a DEBUG reset, rather than the normal POWERON or MANUAL reset performed by transmitting signals on the $\overline{\text{RESETP}}$ 608 and $\overline{\text{RESETM}}$ 609 pins. The signal used is referred to as RESET_MODE. The signal is obtained by sampling the dm_in 606 signal during a reset of circuit 101.

According to one aspect of the invention, a reference message may be sent to an external system 106 in predetermined intervals, such that information may be kept current at system 106. Particularly, the reference message may indicate timing information to external system 106, such that system 106 may be apprised of the current time in debug circuit 103. Also, relative timing information in trace messages following the reference message may be calculated from the reference message timing information. Further, the reference message may include a copy of the program counter value stored in debug circuit 103, such that relative program counter information in trace messages following the reference message may be calculated from the reference message program counter value. Further, address information may also be included in the reference message for the purpose of calculating offset addresses. The timing information program counter, and address information may be absolute values.

Also, a reference message may be sent to external system 106 during continuous idle periods greater than a predetermined number of time intervals. For example, a predetermined time interval may be 256 time intervals. That is, if a transmission circuit 215 has been idle for more than 256 intervals prior to sending a trace message, a reference message may be inserted into a first-in first-out (FIFO) buffer of trace storage unit 205 before the next trace message.

Table 8 below shows one embodiment of a format and content of a reference message:

TABLE 7

Reference Message
Reference Message (14-bytes)

| Field | Size | Header Bit Positions | Description |
|---|---|---|---|
| Message Type | 3-bits | [0, 2] | 0b100 |
| Reserved | 5-bits | [3, 7] | |
| Time Value | 5-bytes | N/A | The value of a 40-bit timestamp counter in the debug circuit. |
| PC Address | 4-bytes | | The absolute 4-byte address of a shadowed program counter in the debug circuit at the time this message is generated. This address becomes a new reference PC value and the relative address in a trace message which follows will be based on this value. |
| BA Address | 4-bytes | | The absolute 4-byte reference address associated with the bus analyzer (BA). This value becomes the new bus analyzer reference address and the relative address in a bus analyzer trace message which follows will be based on this value. |

Debug circuit 103 may include a register which determines whether timestamps are included in trace messages. If included, the timestamp field of a trace message such as that shown in Table 1 may be used to specify a time difference from the last reference message. Alternatively, the timestamp field may contain an absolute value of a timestamp.

An external system 106 such as a debug tool may connect to an integrated circuit 101 via a JTAG debug link as shown in FIG. 14. For debug tools such as an E10A debug tool available from the Hitachi Limited, the RESET signal in the JTAG interface 208B is an output from the target board which allows the tool to detect when a board-level reset function has occurred, for example, when a user has pressed a reset button such as the switch associated with a power generation and reset unit 1001. However, some tools may not have the capability to initiate a POWERON, MANUAL or DEBUG reset via signals in the interface. However, a facility is provided such that the debug tool can perform either a processor reset (which resets the processor) or a DEBUG reset (which resets the debug circuit) by writing to a register of debug circuit. A RESET_MODE signal is assigned to an external link pin not currently connected and this allows the tool to force a DEBUG reset when the reset button in unit 1001 is pressed. The RESET signal in the JTAG debug interface could be bidirectional allowing the tool to initiate one type of hard reset, either POWERON, MANUAL or DEBUG depending on board-level jumpers as shown in FIG. 14.

A debug tool such as an ST JEI debug adapter available from STMicroelectronics, Inc. connects to integrated circuit 101 using link 208A as shown in FIG. 14. The tool is able to directly reset processor 102 using the RESET signal of interface 208A. A jumper on the target board connects this signal to either the $\overline{\text{RESETP}}$ pin or the $\overline{\text{RESETM}}$ pin. As part of the reset function initiated when either the $\overline{\text{RESETP}}$ pin or the $\overline{\text{RESETM}}$ pin is pulsed low, integrated circuit 101 senses the state of signal dm_in. If signal dm_in is sampled low, a DEBUG reset is initiated regardless of whether the $\overline{\text{RESETP}}$ pin or the $\overline{\text{RESETM}}$ pin was asserted. Also, a DEBUG reset from a tool connected to link 208A can also be performed by writing to debug circuit register 209.

Integrated circuit 101 may have a suspend function which suspends the performance of processor 102. The dm_isync signal 607 has two functions. Its primary function is the synchronization pin for messages sent to integrated circuit 101 from external system 106. Its secondary function controls processor suspend state. At the end of a POWERON, MANUAL or DEBUG reset function, when RESET is pulled high, the processor can either start executing boot code or can enter a suspended state depending on the state of the dm_isync signal 607 sampled when RESET goes from low to high. If dm_isync 607 is sampled low at the end of the reset phase, the processor may remain suspended on the assumption that various processor registers will be loaded by an external system 106. At some later time, external system 106 will release the processor from its suspended state by writing to debug register 209. If signal dm_isync 607 is sampled high at the end of the reset phase, the processor starts executing boot code. A pin associated with the dm_isync signal 607 may include an internal pull-up resistor to ensure that when no external system 106 is connected to link 208A, the processor is not suspended at the end of reset. Table 8 below lists one embodiment of reset functions performed using the $\overline{\text{RESETP}}$ and $\overline{\text{RESETM}}$ signals:

TABLE 8

Alternative Reset Functions

| dm_in State | Action When $\overline{\text{RESETP}}$ Asserted | Action When $\overline{\text{RESETM}}$ Asserted |
|---|---|---|
| high (internal pull-up resistor) | POWERON reset. | MANUAL reset. |
| low | DEBUG reset. | DEBUG reset. |

The processor suspend function is also available to JTAG-connected tools. The JTAG debug link signal SUSPEND is an AC-decoupled version of the dm_isync signal 607 of link 208A. Since dm_isync 607 is a high-speed signal used by link 208A, board-level products may include a series resistor between SUSPEND pin in the JTAG header and the dm_isync signal pin. This series resistor (of value around 1 K ohm, for example) is located close to the dm_isync signal pin to minimize effects of extra trace length on a printed circuit board. A bypass capacitor may also be required.

Figure 15:
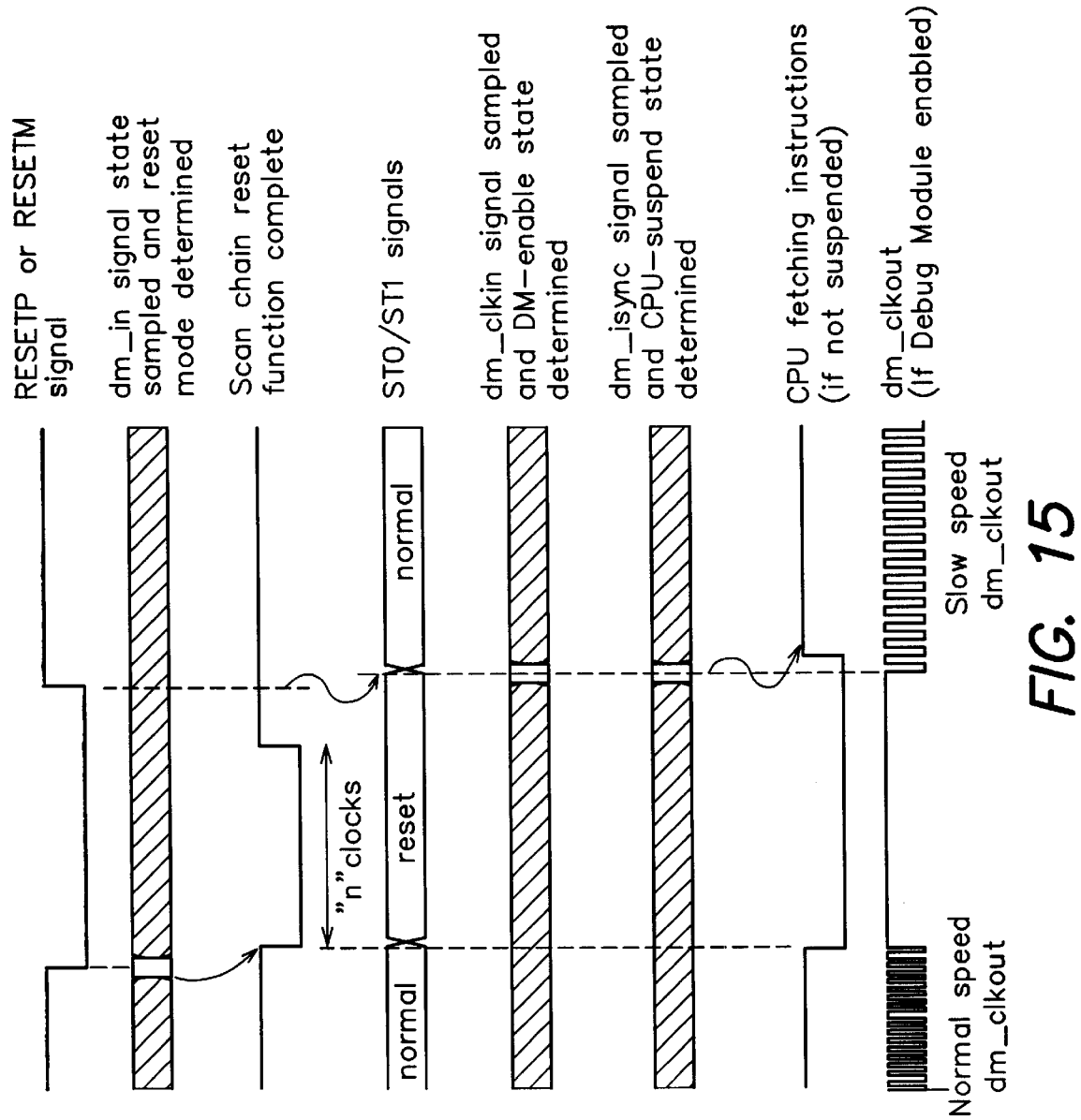
FIG. 15 is a timing diagram showing resetting of a processor by applying an external signal.
Figure 16:
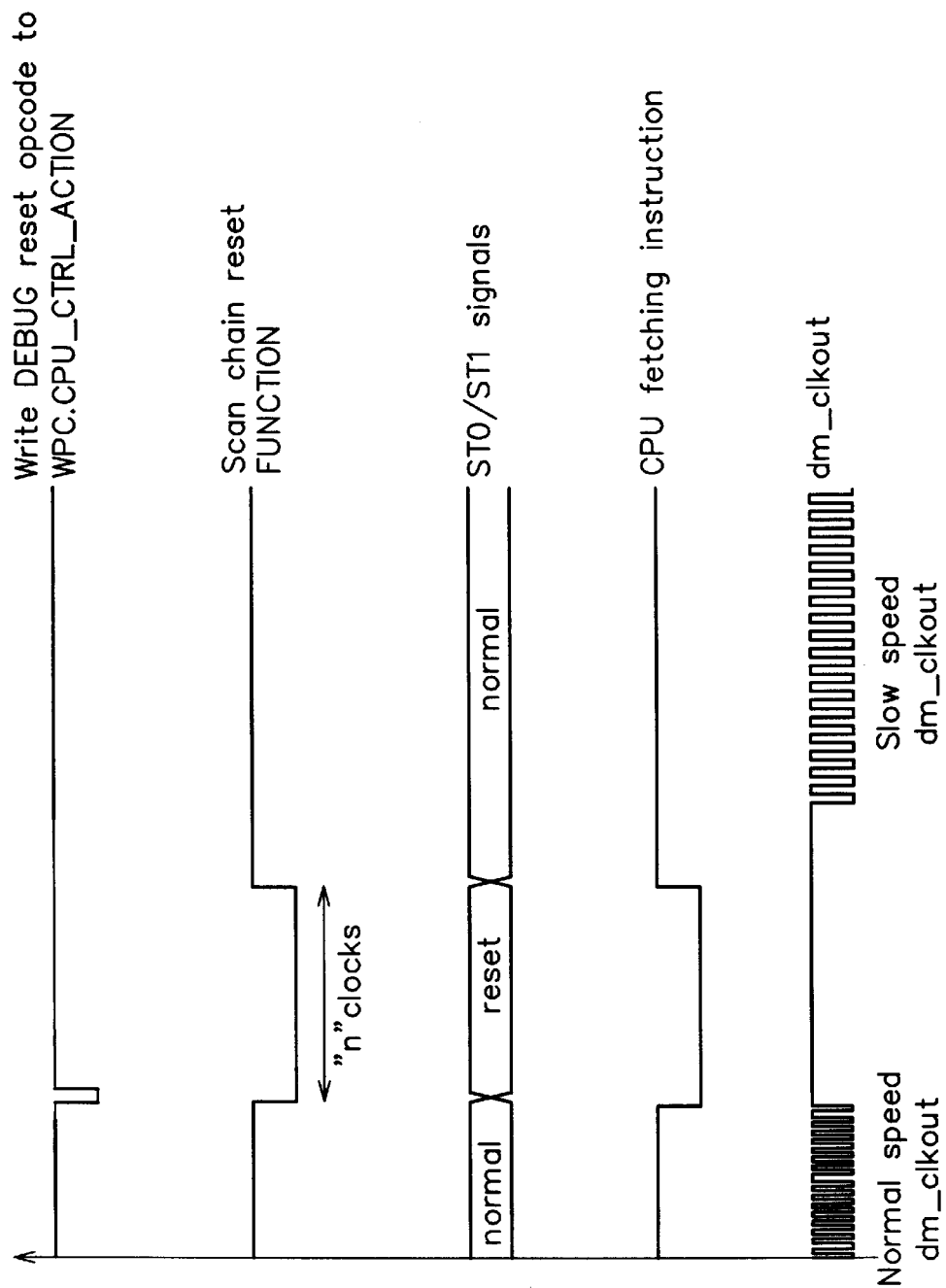
FIG. 16 is a timing diagram showing resetting of a processor by writing to a register.

FIGS. 15 and 16 show timings described above for resetting of processor 102 by applying an external signal and writing to a debug register 209, respectively. In FIG. 15, either a $\overline{\text{RESETP}}$ or $\overline{\text{RESETM}}$ signal corresponding to a POWERON reset or MANUAL reset, respectively, is held low to cause a reset of processor 102. As discussed above, external system 106 may monitor signal dm__in 606 to determine whether a reset has occurred. After n clock cycles, the reset of processor 102 is complete. External system 106 may monitor STATUS0/STATUS1 signals 108 to determine whether circuit 101 is operating normally and can receive requests. When the circuit 101 is operating normally, signal dm__clkin signal 605 may be sampled and a debug circuit state determined. Also, signal dm__isync 607 may be sampled and the processor suspend state determined. At some later time after circuit 101 has stabilized, processor 102 may begin fetching and executing instructions. It is noted that the transmission speed associated with a link may change as a result of resetting circuit 101.

In FIG. 16, an external system may reset circuit 101 by writing a value to a register, such as a register called WPC.CPU__CTRL__ACTION. The value may be, for example, a value representing a debug reset opcode, which may be any predefined value. After the opcode is written into the register, the reset procedure may be similar to that described above with respect to providing a POWERON or MANUAL reset. For example, external system 106 may monitor STATUS0/STATUS1 signals 108 to determine whether circuit 101 is operating normally. It should be understood that different timing relationships may be used between the signals to determine when integrated circuit 101 is operational.

While various embodiments of the present invention have been described above, it should be understood that they have been presented by way of example only, and not limitation. Thus, the breadth and scope of the present invention are not limited by any of the above exemplary embodiments, but are defined only in accordance with the following claims and their equivalents.

What is claimed is:

1. A method for communicating between an integrated circuit and an off-chip device, the method comprising steps of:
    transmitting a message off-chip at a transmission frequency proportional to an on-chip system bus transmission frequency;
    automatically adjusting the transmission frequency in response to a change in bus transmission frequency.

2. The method according to claim 1, wherein the transmission frequency is proportional to the bus transmission frequency by a whole number.

3. The method according to claim 1, wherein a degree of proportionality may be changed by manipulating a register associated with a programmable divider circuit.

4. The method according to claim 3 wherein the register is manipulated by at least one of an external system and an on-chip device.

5. The method according to claim 1, wherein a value of a receive frequency depends upon a value of the transmission frequency.

6. The method according to claim 1, wherein the transmission frequency is determined by a divider circuit, wherein the divider circuit determines the transmission frequency based on the bus transmission frequency and a divider value stored in a register associated with the integrated circuit.

7. The method according to claim 6, wherein the divider value is a default value upon a reset of the integrated circuit device.

8. The method according to claim 7, wherein the off-chip device initiates the reset, and changes its reception frequency to adapt to the default value.

9. The method according to claim 6, wherein the divider circuit resets the transmission frequency to a default value upon a reset of the integrated circuit.

10. An integrated circuit comprising:
    a system bus having a system bus frequency;
    a communication circuit for transmitting messages at a transmission frequency between the integrated circuit and an off-chip device; and
    a divider circuit, operatively coupled to the system bus and the communication circuit, the divider being configured to adjust the transmission frequency in response to a change in system bus frequency.

11. The integrated circuit according to claim 10, wherein the transmission frequency is kept proportional to the system bus frequency.

12. The integrated circuit according to claim 11, wherein the transmission frequency is proportional to the bus transmission frequency by a whole number.

13. The integrated circuit according to claim 10, the integrated circuit further comprising a register, and data stored within the register determines a degree of proportionality between the transmission frequency and the system bus frequency.

14. The integrated circuit according to claim 13, wherein the communication circuit includes an interface to the off-chip device, and the communication circuit is adapted to receive a request message from the off-chip device to write a data value in the register which determines the degree of proportionality.

15. The integrated circuit according to claim 10, wherein a receive frequency of the communication circuit depends upon the transmission frequency.

16. The integrated circuit according to claim 10, wherein the divider circuit determines the transmission frequency based on the bus transmission frequency and a divider value stored in a register associated with the integrated circuit.

17. The integrated circuit according to claim 16, wherein the divider value is a default value upon a reset of the integrated circuit device.

18. The integrated circuit according to claim 17, wherein the off-chip device initiates the reset, and changes its reception frequency to adapt to the default value.

19. The integrated circuit according to claim 16, wherein the divider circuit resets the transmission frequency to a default value upon a reset of the integrated circuit.

* * * * *